US008619469B2

(12) United States Patent
Pasotti et al.

(10) Patent No.: US 8,619,469 B2
(45) Date of Patent: Dec. 31, 2013

(54) FTP MEMORY DEVICE WITH PROGRAMMING AND ERASING BASED ON FOWLER-NORDHEIM EFFECT

(75) Inventors: Marco Pasotti, Travaco' Siccomario (IT); Marcella Carissimi, Treviolo (IT); Davide Lena, Taibon (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 150 days.

(21) Appl. No.: 12/968,522

(22) Filed: Dec. 15, 2010

(65) Prior Publication Data

US 2011/0157975 A1 Jun. 30, 2011

(30) Foreign Application Priority Data

Dec. 30, 2009 (IT) .............................. MI2009A2348

(51) Int. Cl.
*G11C 16/04* (2006.01)
(52) U.S. Cl.
USPC .............. 365/185.1; 365/185.18; 365/185.27
(58) Field of Classification Search
USPC ..................................................... 365/185.1
See application file for complete search history.

(56) References Cited

U.S. PATENT DOCUMENTS

| 4,611,309 | A | * | 9/1986 | Chuang et al. | ........... | 365/185.08 |
| 4,672,580 | A | * | 6/1987 | Yau et al. | ................. | 365/185.08 |
| 4,752,912 | A | * | 6/1988 | Guterman | ................ | 365/185.08 |
| 4,813,018 | A | * | 3/1989 | Kobayashi et al. | ...... | 365/185.08 |
| 4,870,615 | A | * | 9/1989 | Maruyama et al. | ...... | 365/185.06 |
| 5,075,888 | A | * | 12/1991 | Yamauchi et al. | ....... | 365/185.08 |
| 5,140,551 | A | * | 8/1992 | Chiu | ......................... | 365/185.08 |
| 5,262,986 | A | * | 11/1993 | Yamauchi | ................ | 365/185.08 |
| 5,331,590 | A | * | 7/1994 | Josephson et al. | ............ | 365/182 |
| 5,515,320 | A | | 5/1996 | Miwa | | |
| 5,615,150 | A | * | 3/1997 | Lin et al. | .................. | 365/185.17 |
| 6,125,059 | A | | 9/2000 | Hecht | | |
| 6,307,781 | B1 | | 10/2001 | Shum | | |
| 6,876,033 | B2 | | 4/2005 | Cappelletti et al. | | |
| 7,339,829 | B2 | | 3/2008 | Sarig | | |
| 2004/0080982 | A1 | * | 4/2004 | Roizin | ..................... | 365/185.28 |

(Continued)

OTHER PUBLICATIONS

Search Report based on Italian Application Serial No. MI20092348, Ministero dello Sviluppo Economico, Munich, May 19, 2010, pp. 3.

(Continued)

*Primary Examiner* — Son Mai
(74) *Attorney, Agent, or Firm* — Graybeal Jackson LLP

(57) ABSTRACT

An embodiment of a non-volatile memory device integrated in a chip of semiconductor material is proposed. The memory device includes a plurality of memory cells. Each memory cell includes a first well and a second well of first type of conductivity that are formed in an insulating region of a second type of conductivity. The memory cell further includes a first, a second, a third and a fourth region of the second type of conductivity that are formed in the first well; these regions define a sequence of a first selection transistor of MOS type, a storage transistor of floating gate MOS type, and a second selection transistor of MOS type that are coupled in series. The first region is short-circuited to the first well. Moreover, the memory device includes a first gate of the first selection transistor, a second gate of the second selection transistor, and a floating gate of the storage transistor. A control gate of the storage transistor is formed in the second well; the control gate is capacitively coupled with the floating gate.

48 Claims, 18 Drawing Sheets

(56) References Cited

U.S. PATENT DOCUMENTS

| | | |
|---|---|---|
| 2004/0197993 A1 | 10/2004 | Georgescu |
| 2004/0213048 A1 | 10/2004 | Park et al. |
| 2005/0030827 A1* | 2/2005 | Gilliland et al. .............. 365/232 |
| 2007/0223282 A1* | 9/2007 | Sarig ........................ 365/185.23 |
| 2008/0291729 A1 | 11/2008 | Cosmin et al. |
| 2011/0157972 A1* | 6/2011 | Pasotti et al. .............. 365/185.1 |
| 2011/0157977 A1* | 6/2011 | Pasotti et al. .............. 365/185.2 |
| 2011/0310669 A1* | 12/2011 | Ching et al. ............. 365/185.15 |
| 2011/0317492 A1* | 12/2011 | Yao et al. ................. 365/185.28 |

OTHER PUBLICATIONS

Search Report based on Italian Application Serial No. MI20092349, Ministero dello Sviluppo Economico, Munich, May 21, 2010, pp. 3.

Search Report based on Italian Application Serial No. MI20092350, Ministero dello Sviluppo Economico, Munich, May 19, 2010, pp. 3.

* cited by examiner

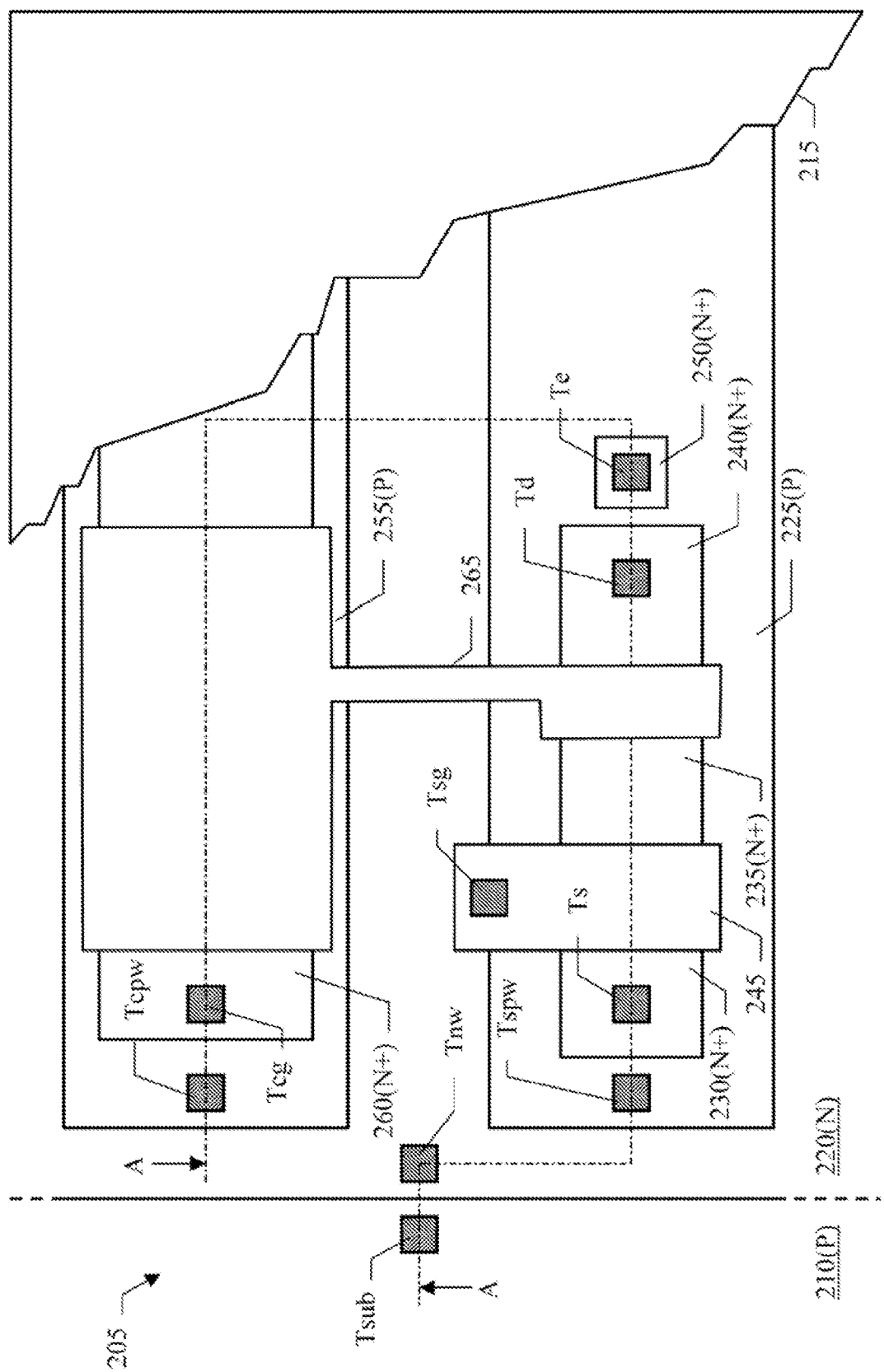

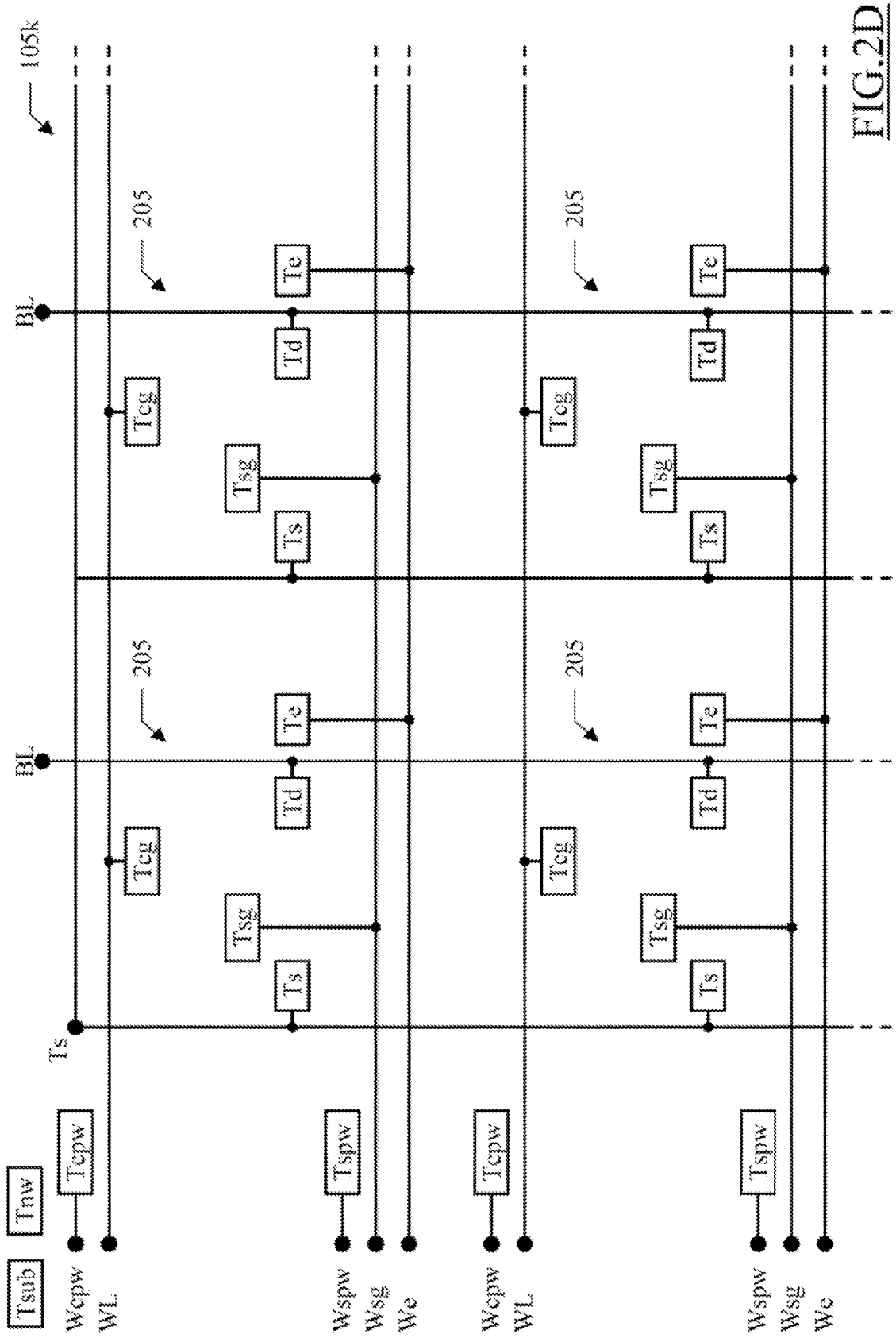

FTP MEMORY DEVICE WITH PROGRAMMING AND ERASING BASED ON FOWLER-NORDHEIM EFFECT

PRIORITY CLAIM

The instant application claims priority to Italian Patent Application No. MI2009A002348, filed Dec. 30, 2009, which application is incorporated herein by reference in its entirety.

RELATED APPLICATION DATA

This application is related to U.S. patent application Ser. No. 12/975,055, entitled FTP MEMORY DEVICE WITH SINGLE SELECTION TRANSISTOR filed Dec. 21, 2010; and is related to U.S. patent application Ser. No. 12/975,155, entitled FTP MEMORY DEVICE PROGRAMMABLE AND ERASABLE AT CELL LEVEL filed Dec. 21, 2010, all of the foregoing applications are incorporated herein by reference in their entireties.

TECHNICAL FIELD

An embodiment relates to the electronics field. More specifically, an embodiment relates to non-volatile memory devices.

BACKGROUND

Non-volatile memory devices are used in applications requiring the storing of information that has to be retained even when the memory devices are not powered. Generally, each memory device includes a matrix of memory cells based on floating-gate MOS storage transistors; each storage transistor has a threshold voltage that may be set (according to an electric charge in its floating gate) to different levels representing corresponding logic values.

For example, in Electrical Erasable and Programmable Read-Only Memories ($E^2$PROMs) each storage transistor may be both programmed (by injecting electric charge into its floating gate) and erased (by removing electric charge from its floating gate) individually—thanks to the use of a set of MOS selection transistors that selectively apply the required voltages to the corresponding storage transistor (with a quite complex structure that may limit the capacity of the $E^2$PROMs to a few kilobytes). On the other hand, flash memories have a simple structure that allows obtaining very high capacities thereof, for example, up to some gigabytes, thanks to the grouping of the memory cells in sectors each integrated in a common well of semiconductor material without any selection transistor (with the flash memory cells being erased by sector).

In both cases, a production process of the memory devices substantially differs from a standard one (for example, in CMOS-technology). Indeed, the storage transistors require an additional polysilicon layer to define their floating gates (besides the one used to define their control gates as in CMOS transistors). This difference adds design complexity, which may significantly increases the manufacturing cost of the memory devices (e.g., on the order of 30% with respect to standard CMOS devices).

In order to solve these problems, Few Time Programmable (FTP) or Cost-Effective memories have been proposed in the last years. In the FTP memories, the memory cells are again grouped in sectors (integrated in corresponding wells). However, the storage transistor of each memory cell now has a distinct control gate region being capacitively coupled with its floating gate; therefore, the FTP memories require a single polysilicon layer, so that they may be manufactured with the standard CMOS production process.

The FTP memories known in the art are generally based on a so-called emitter structure. Particularly, in the emitter-FTP memories, each memory cell includes, in addition to the storage transistor, an MOS selection transistor (being used to select the memory cell for its reading), and a stray BJT injection transistor (being used to implement its programming). The memory cells are programmed by hot electron injection (very fast through their injection transistors) and they are erased by the Fowler-Nordheim effect. An example of emitter-FTP memory is described in U.S. Pat. No. 6,876,033, which is herein incorporated by reference.

This makes the FTP memories very attractive for embedding memories of small capacity (up to some Kbytes) into CMOS devices; indeed, in this case it is possible to add the FTP memories at low cost and with low overhead (since they do not require complex re-design and test operations).

However, FTP-memories have to be erased at the sector level. Moreover, they require very high voltages (both positive and negative) for programming and erasing the memory cells, and high currents for their programming. Particularly, in the emitter-FTP memories, the injection transistors have a stray structure; therefore, the injection transistors often cannot be characterized accurately, and thus they may have to be over-dimensioned to ensure the required performance in every operating condition. Therefore, the currents that are used during the programming of the memory cells may further increase (e.g., up to approximately 0.1-5 mA). This requires very complex charge pumps to generate the required high voltages (from a lower power supply voltage), and at the same time provide the required high currents. In addition, the high voltages and currents involve large power consumption. These high currents also limit a programming parallelism (for example, to 8 memory cells). Moreover, during the erasing of a selected sector, the high voltages applied to its memory cells in part propagate to the other memory cells that are capacitively coupled thereto. As a result, these memory cells are subject to an electric stress that may cause a loss of electric charge in the floating gates of their storage transistors, with an undesired erasing of the memory cells after repeated erasing operations. This limits the data retention of the memory cells, and the number of erasing operations that may be withstood (of the order of a few thousands) before the cells may be rendered inoperable.

SUMMARY

An embodiment is based on the idea of implementing both erasing and programming of a memory cell by Fowler-Nordheim effect.

More specifically, an embodiment is a non-volatile memory device, which is integrated in a chip of semiconductor material. The memory device includes a plurality of memory cells. Each memory cell includes a first well and a second well of a first type of conductivity that are formed in an insulating region of a second type of conductivity. The memory cell further includes a first, a second, a third, and a fourth region of the second type of conductivity that are formed in the first well; these regions define a sequence of a first selection transistor of a MOS type, a storage transistor of a floating gate MOS type, and a second selection transistor of a MOS type that are coupled in series. The first region is short-circuited to the first well. Moreover, the memory device includes a first gate of the first selection transistor, a second gate of the second selection transistor, and a floating gate of the storage transistor. A control gate of the storage transistor is formed in the second well; the control gate is capacitively coupled with the floating gate.

A further embodiment is a system including one or more of these non-volatile memory devices.

Another embodiment is a method for programming this memory device.

A different embodiment is a corresponding method of integrating the non-volatile memory device.

BRIEF DESCRIPTION OF THE DRAWINGS

One or more embodiments of the disclosure, as well as features and the advantages thereof, will be best understood with reference to the following detailed description, given purely by way of a non-restrictive indication, to be read in conjunction with the accompanying drawings (wherein corresponding elements are denoted with equal or similar references and their explanation is not repeated for the sake of brevity, and the name of each entity is generally used to denote both its type and its attributes—such as its value, content and representation—for the sake of simplicity). In this respect, it is expressly intended that the figures may not necessarily be drawn to scale (with some details that may be exaggerated and/or simplified) and that, unless otherwise indicated, they are merely used to conceptually illustrate the structures and procedures described herein. Particularly.

DETAILED DESCRIPTION

Figure 1:
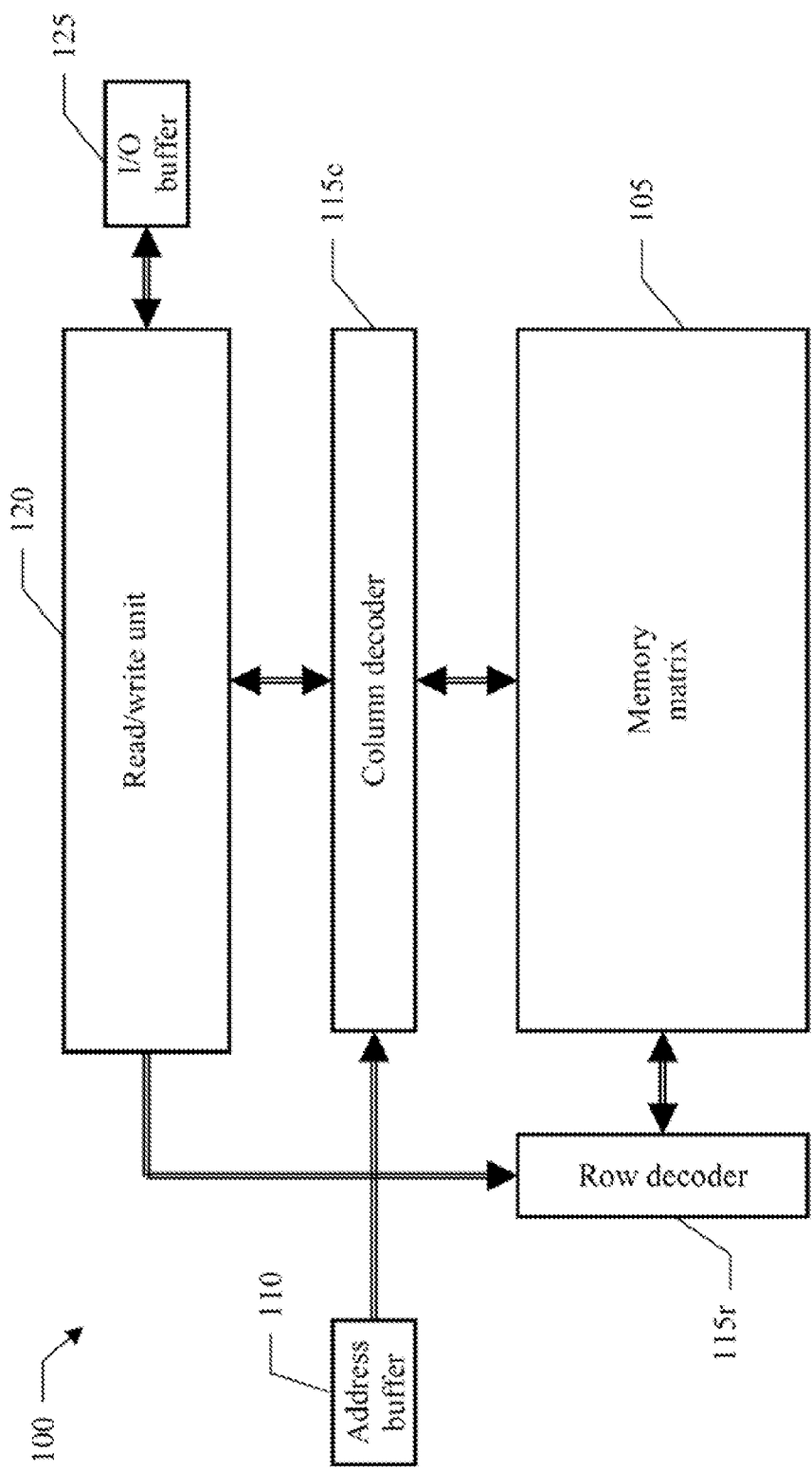
FIG. 1 is a schematic block diagram of a non-volatile memory device wherein an embodiment is applicable.

With reference in particular to FIG. 1, there is shown a schematic block diagram of a non-volatile memory device 100 wherein an embodiment is applicable; particularly, the memory device 100 is of the Cost-Effective or FTP type. The memory device 100 includes a memory matrix 105, which is formed by a plurality of memory cells (not shown in the figure) being organized in rows and columns (for example, 128-512 rows and 512-1024 columns). Each memory cell stores a logic value (for example, one bit). For this purpose, the memory cell is based on a floating gate MOS transistor; this transistor has a threshold voltage that depends on an electric charge in its floating gate. The different levels of the threshold voltage represent corresponding logic values; conventionally, the memory cell is programmed (at a logic value 0) when it exhibits a high threshold voltage, whereas the memory cell is erased (at the logic value 1) when it exhibits a low threshold voltage.

As described in detail in the following, each memory cell can be read and programmed individually; typically, the memory device 100 simultaneously reads and programs a word that is stored into a corresponding page of memory cells in a same row of the memory matrix 105 (for example, 8 memory cells for a word of 8 bits). Conversely, the memory cells are erased at the level of sectors—for example, each sector consisting of a row of memory cells.

An address buffer 110 receives an address of a selected page in the memory matrix 105 (for a corresponding word). Particularly, a portion of the address is provided to a row decoder 115r, which selects the row of the selected page in the memory matrix 105; the other portion of the address is instead supplied to a column decoder 115c, which selects a column in the memory matrix 105 within each packet of columns associated with a corresponding i-th bit of all the words. The address buffer 110 is also used to select a sector that is to be erased (through the row decoder 115r).

A read/write unit 120 controls operation of the row decoder 115r and the column decoder 115c. The read/write unit 120 also includes all the components (such as a power management unit with charge pumps, sense amplifiers, comparators, reference cells, pulse generators, and the like) that are used for writing (i.e., programming or erasing) the memory cells and for reading their logic values. The read/write unit 120 is also coupled with an input/output (I/O) buffer 125; the input/output buffer 125 receives a word to be written into the selected page of the memory matrix 105, or it provides a word that has been read from the selected page of the memory matrix 105 (through the column decoder 115c).

Figure 2B:
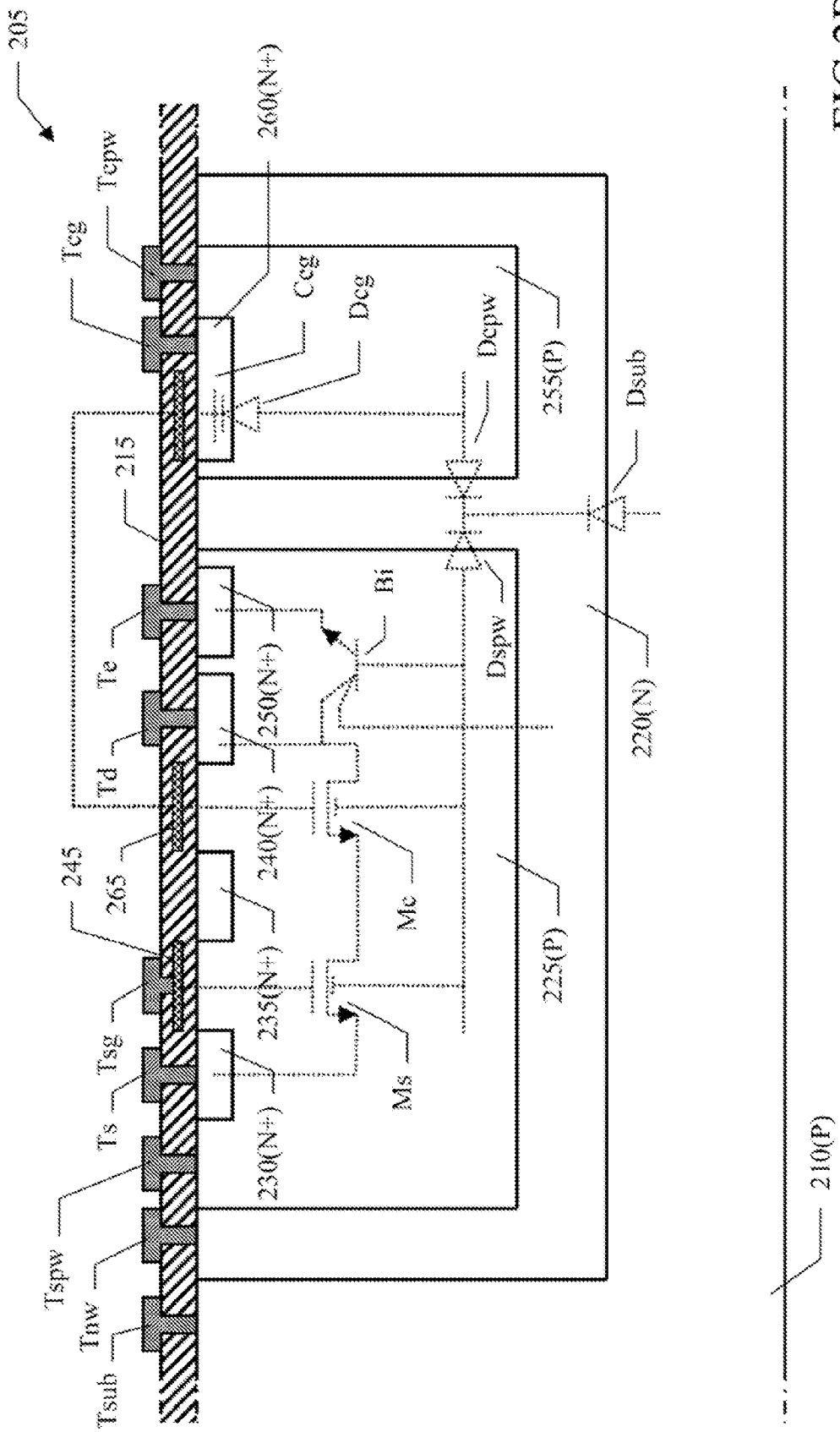
FIG. 2A-FIG. 2B show a simplified implementation of a memory cell.

Moving to FIG. 2A-FIG. 2B, there is shown a simplified implementation of a generic memory cell 205 (of the emitter-FTP type); particularly, FIG. 2A is a (partially cut away) top view illustrating a layout of the memory cell 205, whereas FIG. 2B is a cross-section view of the same memory cell 205 along the directrix A-A of FIG. 2A.

The whole memory device is integrated in a chip of semiconductor material; as usual, the concentrations of N type and P type impurities (or dopant) are denoted by adding the sign + or the sign − to the letters N and P to indicate a high or low concentration of impurities, respectively; the letters N and P without the addition of any sign + or − denote concentrations of intermediate value.

Particularly, the chip includes a P-substrate 210. A conductive pad (for example, made of metal) contacts the P-substrate 210 (for example, at a highly doped contact region thereof, not shown in the figure) through a window that is open in an insulating layer 215 (for example, a field oxide) protecting a front surface of the chip, so as to define a P-substrate terminal Tsub. All the memory cells 205 are formed in a common N-well 220 that extends into the P-substrate 210 from the front surface of the chip; for example, the N-well 220 is formed by a buried layer (being obtained with a high-energy implantation process) and an external contact ring. A conductive pad contacts the N-well 220 through a window of the insulating layer 215, so as to define an N-well terminal Tnw.

The memory cell 205 includes a storage section, which is housed in a storage P-well 225 that extends into the N-well 220 from the front surface of the chip (with the storage P-well 225 that is common for all the memory cells 205 of a corresponding row); a conductive pad contacts the storage P-well 225 through a window of the insulating layer 215, so as to define a storage P-well terminal Tspw. Particularly, the storage section of the memory cell 205 includes three N+ regions 230, 235, and 240; all the N+ regions 230, 235 and 240 extend into the storage P-well 225 from the front surface of the chip (for example, being obtained with a diffusion process), with the N+ region 235 that is arranged between the N+ region 230 and the N+ region 240. A conductive pad contacts the N+ region 230 through a window of the insulating layer 215 so as to define a corresponding terminal Ts, and another conductive pad contacts the N+ region 240 through a window of the insulating layer 215 so as to define a corresponding terminal Td (while the N+ region 235 is left floating). A polysilicon layer 245 extends over a channel region of the storage P-well 225 between the N+ region 230 and the N+ region 235; the polysilicon layer 245 is separated from the channel region of the storage P-well 225 by a thin portion of the insulating layer 215. A conductive pad contacts the polysilicon layer 245 through a window of the insulating layer 215 so as to define a corresponding terminal Tsg. An N+ region 250 extends into the storage P-well 225 from the front surface of the chip; a conductive pad contacts the N+ region 250 through a window of the insulating layer 215 so as to define a corresponding terminal Te.

The memory cell 205 further includes a control section, which is housed in a control P-well 255 that extends into the N-well 220 from the front surface of the chip (with the control P-well 255 that is common for all the memory cells 205 of a corresponding row); a conductive pad contacts the control P-well 255 through a window of the insulating layer 215, so as to define a control P-well terminal Tcpw. Particularly, the control section of the memory cell 205 includes an N+ region 260, which extends into the control P-well 255 from the front surface of the chip (with the N+ region 260 that is common for all the memory cells 205 of the corresponding row); a conductive pad contacts the N+ region 260 through a window of the insulating layer 215 so as to define a corresponding terminal Tcg.

The storage section and the control section of the memory cell 205 are coupled through a polysilicon layer 265. The polysilicon layer 265 extends from a channel region of the storage P-well 225 (between the N+ region 235 and the N+ region 240) to the N+ region 260. The polysilicon layer 265 is separated from the channel region of the storage P-well 225 and from the N+ region 260 by a thin portion of the insulating layer 215, while it is separated from the rest of the chip by the whole (thicker) insulating layer 215.

Figure 2C:
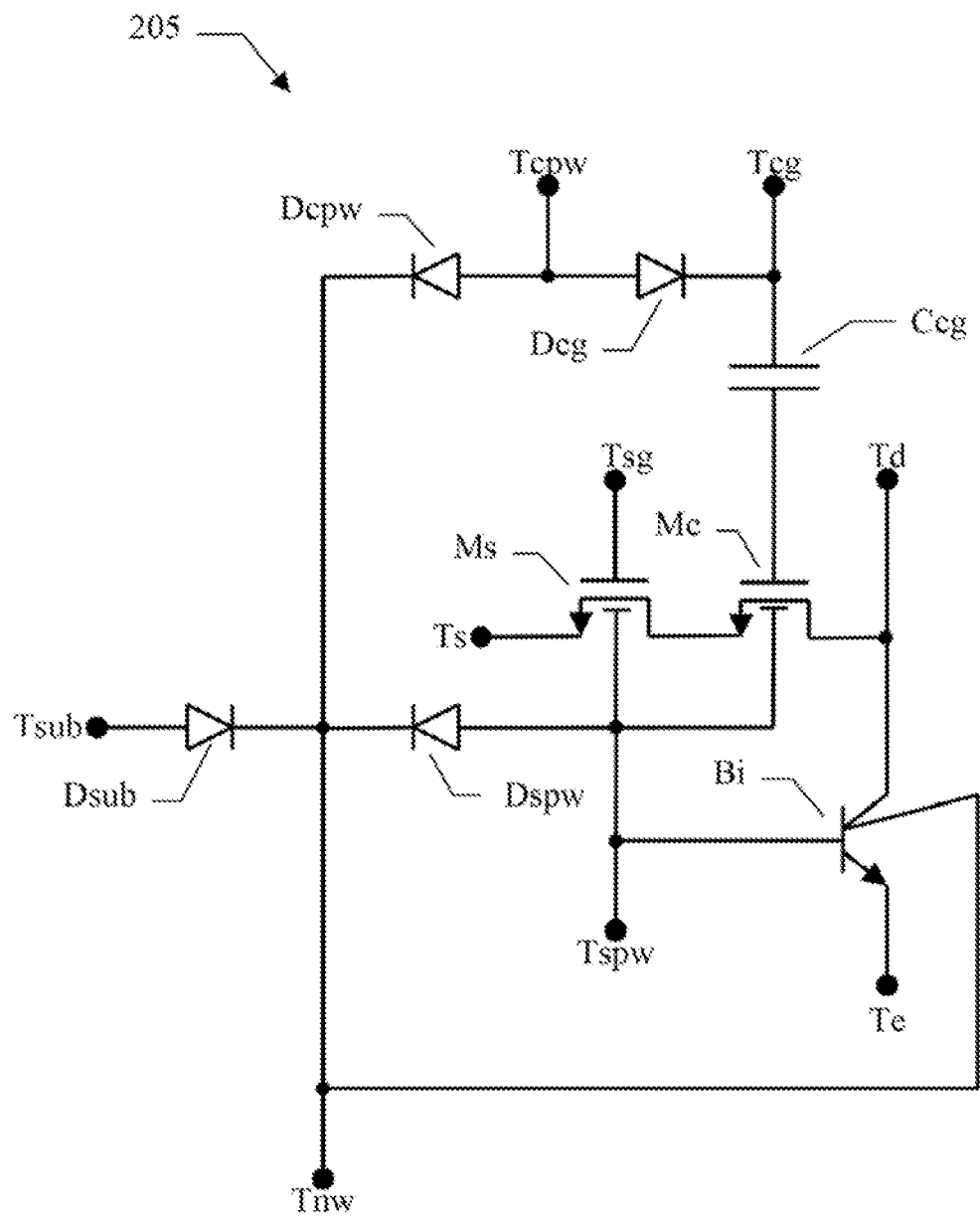
FIG. 2C is an equivalent circuit of the memory cell of FIGS. 2A-2B.

An equivalent circuit of this memory cell 205 is shown in FIG. 2C. Considering FIG. 2C together with FIG. 2B, an N-MOS selection transistor Ms and an N-MOS floating gate storage transistor Mc are formed in a common body defined by the storage P-well 225. Particularly, the selection transistor Ms is defined by the N+ region 230 (source), the N+ region 235 (drain), and the polysilicon layer 245 (gate); the storage transistor Mc is instead defined by the N+ region 235 (source), the N+ region 240 (drain), the polysilicon layer 265 (floating gate), and the N+ region 260 (which forms an implanted capacitor Ccg with the floating gate 265, so as to act as its control gate). The selection transistor Ms has a source terminal (Ts), a selection gate terminal (Tsg), and a drain terminal that is coupled to a source terminal of the storage transistor Mc, which in turn has a control gate terminal (Tcg) and a drain terminal (Td).

The memory cell 205 also includes a (composite) NPN injection transistor Bi. The injection transistor Bi is formed by two stray transistors. Particularly, a lateral stray transistor is defined by the N+ region 250 (emitter), the storage P-well 225 (base), and the N+ region 240 (collector); moreover, a vertical stray transistor is defined by the same N+ region 250 (emitter), the same storage P-well 225 (base), and the N-well 220 (collector). The injection transistor Bi has an emitter terminal (Te), a base terminal (Tspw), and two collector terminals (Td and Tnw).

In the storage section of the memory cell 205, a diode Dspw is formed by the P-N junction between the storage P-well 225 and the N-well 220; the diode Dspw has an anode terminal (Tspw)—which is coupled to the base terminal of the injection transistor Bi and to the common body of the storage transistor Mc and the selection transistor Ms—and a cathode terminal (Tnw). Instead, in the control section of the memory cell 205 a diode Dcg is formed by the P-N junction between the control P-well 255 and the control gate region 260; the diode Dcg has an anode terminal (Tcpw) and a cathode terminal (Tcg), which is coupled to the capacitor Ccg. Moreover, as above a diode Dcpw is formed by the P-N junction between the control P-well 255 and the N-well 220; the diode Dcpw has an anode terminal (Tcpw) that is coupled to the cathode terminal of the diode Dcg, and a cathode terminal (Tnw). At the end, another diode Dsub is formed by the P-N junction between the P-substrate 210 and the N-well 220; the diode Dsub has an anode terminal (Tsub), and a cathode terminal (Tnw) that is coupled to the cathode terminals of the diodes Dspw and Dcpw.

A conceptual representation of the architecture of a memory device based on this memory cell 205 is shown in FIG. 2D. Considering FIG. 2D together with FIG. 2C, in the memory matrix (denoted with the reference 105k) the common P-substrate terminal Tsub is biased to the lowest voltage that is available in the memory device (for example, −10V); in this way, the diode Dsub is always reverse biased, so as to insulate the N-well. The memory matrix 105k then includes the common N-well terminal Tnw. Moreover, the source terminals Ts of all the memory cells 205 of the memory matrix 105k are coupled together.

In each row of the memory matrix 105k, the common storage P-well terminal Tspw and the common control P-well terminal Tcpw are coupled to a corresponding storage P-well line Wspw and control P-well line Wcpw, respectively; both the lines Wspw and Wcpw are driven by the row decoder (not shown in the figure). The control gate terminals Tcg of all the memory cells 205 of each row are coupled to a corresponding word line WL, which is driven by the row decoder. The drain terminals Td of all the memory cells 205 of each column of the memory matrix 105k are coupled to a corresponding bit line BL, which is driven by the column decoder (not shown in the figure). The selection gate terminals Tsg and the emitter terminals Te of all the memory cells 205 of each row are coupled to a corresponding selection gate line Wsg and emitter line We, respectively (both of them driven by the row decoder).

As described in detail in the following, the storage transistor Mc is used to store the logic value of the memory cell 205. The selection transistor Ms is instead used to select the memory cell 205 to be read along the corresponding column (removing the effect of any unselected memory cell 205 on the same column that is depleted at a negative threshold voltage).

Figure 2E:
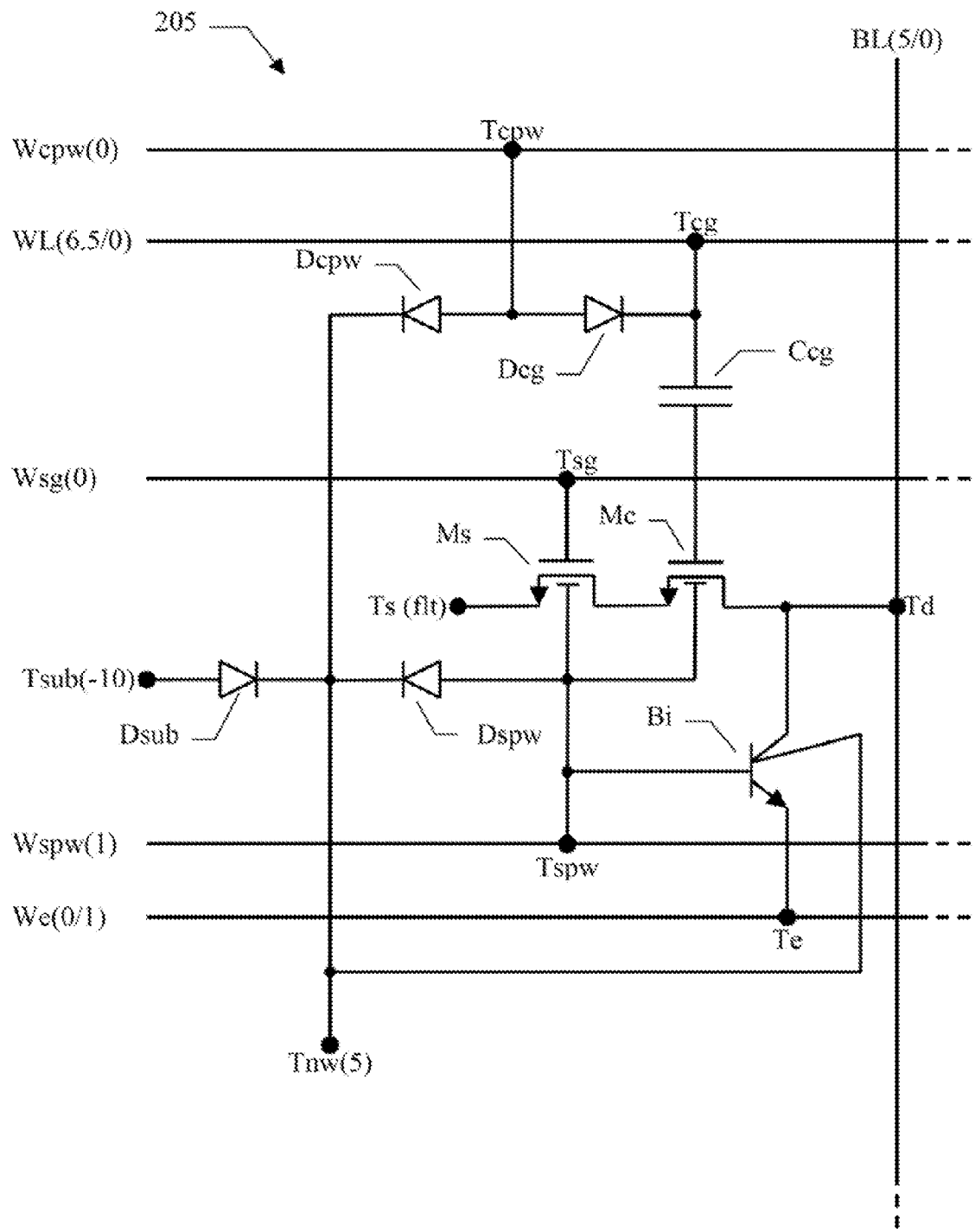
FIG. 2D shows a conceptual representation of an architecture of a memory device based on the memory cell of FIGS. 2A-2C, FIG. 2E-FIG. 2G show the biasing of the memory cell of FIGS. 2A-2D during a programming operation, an erasing operation, and a reading operation, respectively.

Particularly, with reference to FIG. 2E together with FIG. 2D, the memory device is programmed by Substrate Hot Electrons (SHE) injection. For this purpose, during a programming operation of a selected memory cell 205 (of a page in a corresponding row), the common source terminal Ts is left floating and all the selection gate lines Wsg are biased to a reference voltage (or ground). The bit line BL of the selected memory cell 205 (and then its drain terminal Td) is biased to a high positive voltage (for example, 5V), while the other bit lines BL are biased to ground. Moreover, the emitter line We of the selected memory cell 205 is biased to ground, while the other emitter lines We are biased to a low positive voltage (for example, 1V). The word line WL of the selected memory cell 205 (and then its control gate terminal Tcg) is biased to a very high positive voltage (for example, 6.5V), while the other word lines WL are biased to ground. All the control P-well lines Wcpw are biased to ground, and all the storage P-well lines Wspw are biased to the same voltage of 1V. The common N-well terminal Tnw is biased to the same voltage of 5V.

In this way, all the diodes Dspw, Dcpw and Dcg are reverse biased (so as to insulate the storage P-well, the control P-well and the control gate, respectively, of each row), and all the selection transistors Ms are switched off. The selected memory cell 205 is enabled by the voltage at its control gate terminal Tcg (6.5V), which is transferred to the body of the storage transistor Mc by capacitive coupling and then creates an N-channel therein by charge inversion, and by the voltage at its drain terminal Td (5V), which is directly applied to this N-channel. At the same time, the injection transistor Bi is switched on; therefore, substrate electrons are generated in the body of the storage transistor Mc, with part of them that diffuses towards its N-channel. The substrate electrons that reach the N-channel of the storage transistor Mc are accelerated by the electric field defined by the potential difference between the N-channel (5V) and the body (1V). Some of the substrate electrons (denoted as hot substrate electrons) gain energy higher than a potential barrier of the thin insulating layer below the floating gate, so as to be injected into it (and then remain trapped therein).

Conversely, in each other (unselected) memory cell 205 the biasing of its storage transistor Mc is unable to inject electrons into the corresponding floating gate; indeed, its control gate terminal Tcg and/or its drain terminal Td are at ground; in any case, the injection transistor Bi is always switched off.

Figure 2F:
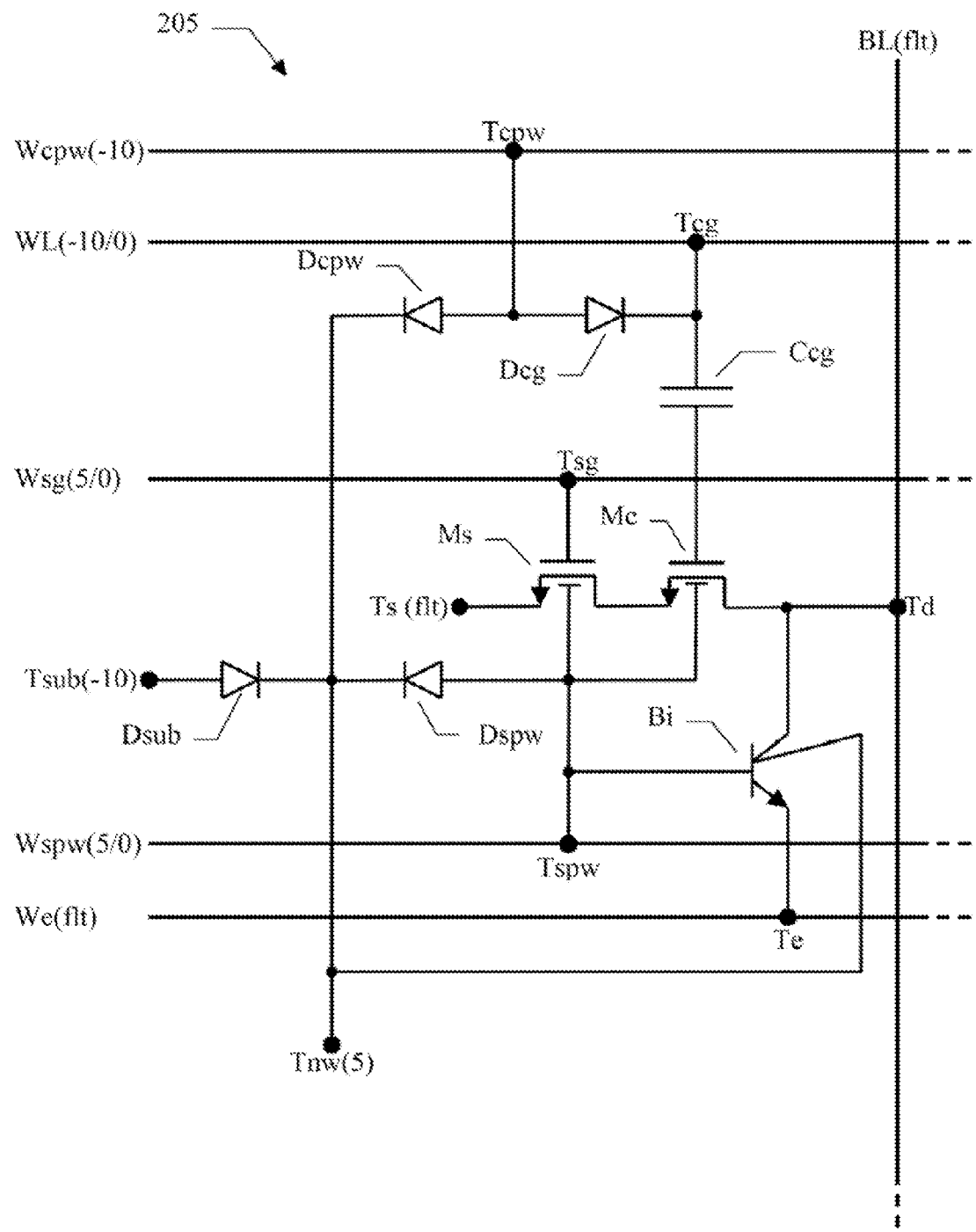

As shown in FIG. 2F together with FIG. 2D, the memory device is instead erased by Fowler-Nordheim effect, at the level of sectors each one consisting of a row of memory cells 205. For this purpose, during an erasing operation of a selected sector, the common source terminal Ts, all the bit lines BL (and then all the drain terminals Td), and all the emitter lines We are left floating. The word line WL of the selected sector (and then the control gate terminals Tcg of its memory cells 205) is biased to a very high negative voltage (for example, −10V), while the other word lines WL are biased to ground. At the same time, the storage P-well line Wspw of the selected sector is biased to a high positive voltage (for example, 5V), while the other storage P-well lines Wspw are biased to ground. The selection gate lines Wsg are biased to the same voltages as the storage P-well lines Wspw 5V for the selected sector and ground otherwise). Moreover, all the control P-well lines Wcpw are biased to the same voltage of −10V, and the common N-well terminal Tnw is biased to the same voltage of 5V.

In this way, all the diodes Dspw, Dcpw and Dcg are reverse biased, and all the selection transistors Ms and the injection transistors Bi are switched off. Each memory cell 205 of the selected sector is enabled by the voltage at the control gate terminal Tcg of the storage transistor Mc (−10V), which is transferred to its floating gate by capacitive coupling, and by the voltage at its storage P-well (5V), which is directly applied to the body of the storage transistor Mc (with the voltage of 5V at the selection gate Tsg that reduces its electric stress); therefore, the very high electric field defined by the potential difference between the floating gate (−10V) and the body (5V) of the storage transistor Mc generates a low Fowler-Nordheim current by quantum-mechanical tunneling, which current extracts the electrons from its floating gate. This condition is maintained for a time sufficient to ensure that all the memory cells 205 of the selected sector are erased (for example, 150-300 µs). Therefore, because of the inevitable spread of characteristics of the memory cells 205, most of them will be over-erased to a negative threshold voltage (i.e., they are depleted).

Conversely, in each (unselected) memory cell 205 of the other sectors, no electric field is defined between the floating gate and the body of the storage transistor Mc (since they are both at ground), so that no electrons are extracted from its floating gate. However, all the bit lines BL (floating) propagate the voltage of the storage P-well of the selected sector (5V) to the storage P-well of each unselected memory cell 205; therefore, the unselected memory cell 205 is subject to a electric stress (being caused by the electric field defined by the potential difference between the floating gate and the body). This electric stress may cause a loss of electrons in the floating gate of its storage transistor Mc after repeated erasing operations, with an undesired erasing of the unselected memory cell 205.

Figure 2G:
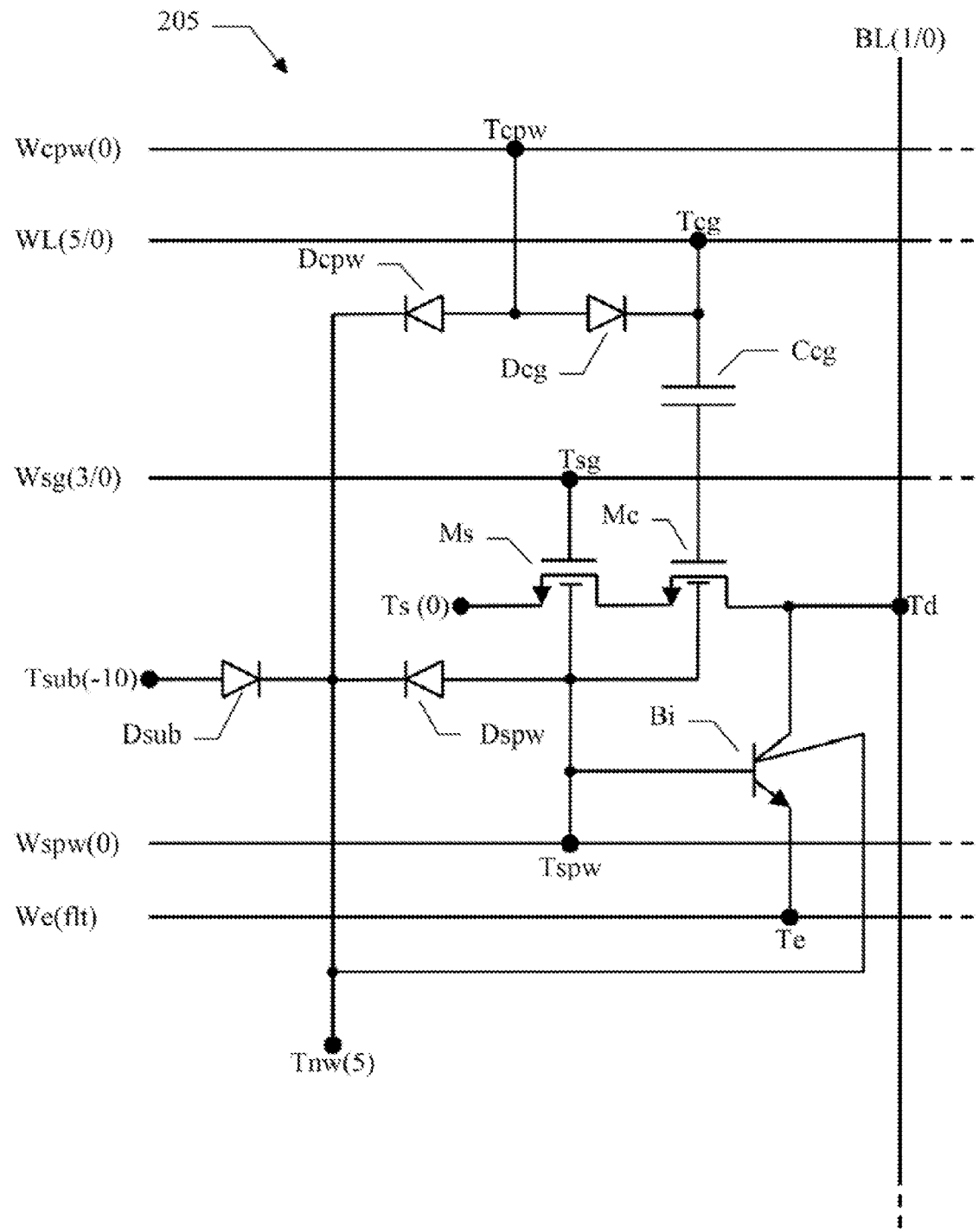

At the end, during a reading operation of a selected memory cell 205 (of a page in a corresponding row), as shown in FIG. 2G together with FIG. 2D, all the emitter lines We are left floating, and the common source terminal Ts is biased to ground. The bit line BL of the selected memory cell 205 (and then its drain terminal Td) is biased to a very low positive voltage (for example, 1V), while the other bit lines BL are biased to ground. At the same time, the word line WL of the selected memory cell 205 (and then its control gate terminal Tcg) is biased to a high positive voltage (for example, 5V), while the other word lines WL are biased to ground. The selection gate line Wsg of the selected memory cell 205 is biased to a low positive voltage (for example, 3V), while the other selection gate lines Wsg are biased to ground. All the control P-well lines Wcpw are biased to ground, all the storage P-well lines Wspw are biased to ground, and the common N-well terminal Tnw is biased to the same voltage of 5V.

In this way, all the diodes Dspw, Dcpw and Dcg are reverse biased, and all the injection transistors Bi are switched off. The selected memory cell 205 is enabled by the voltage at the control gate terminal Tcg of the storage transistor Mc (5V), which is transferred to its floating gate by capacitive coupling, and by the voltage at its drain (1V); at the same time, the selection transistor Ms is switched on (so as to bring the source of the storage transistor Mc to ground). If the selected memory cell 205 is erased it has a low threshold voltage, which is lower than the voltage that is applied between its floating gate (5V) and source Ts through the selection transistor Ms (0V); therefore, the storage transistor Mc is switched on and a current flows through the corresponding bit line BL, so that the logic value 1 is read. On the other hand, if the selected memory cell 205 is programmed it has a high threshold voltage (higher than the voltage that is applied between its floating gate and source); therefore, the storage transistor Mc is switched off and no current flows through the corresponding bit line BL, so that the logic value 0 is read.

Conversely, in each other (unselected) memory cell 205 that is coupled to the same bit line BL of the selected memory cell 205, the selection transistor Ms is switched off. In this way, no current can flow through the storage transistor Mc, even when the memory cell 205 is depleted (i.e., it exhibits a negative threshold voltage), so that the unselected memory cell 205 does not interfere with the reading of the selected memory cell 205. In each one of the other unselected memory cells 205, the storage transistor Mc is always switched off (and the corresponding bit line BL is discoupled from the read/write unit).

Figure 3:
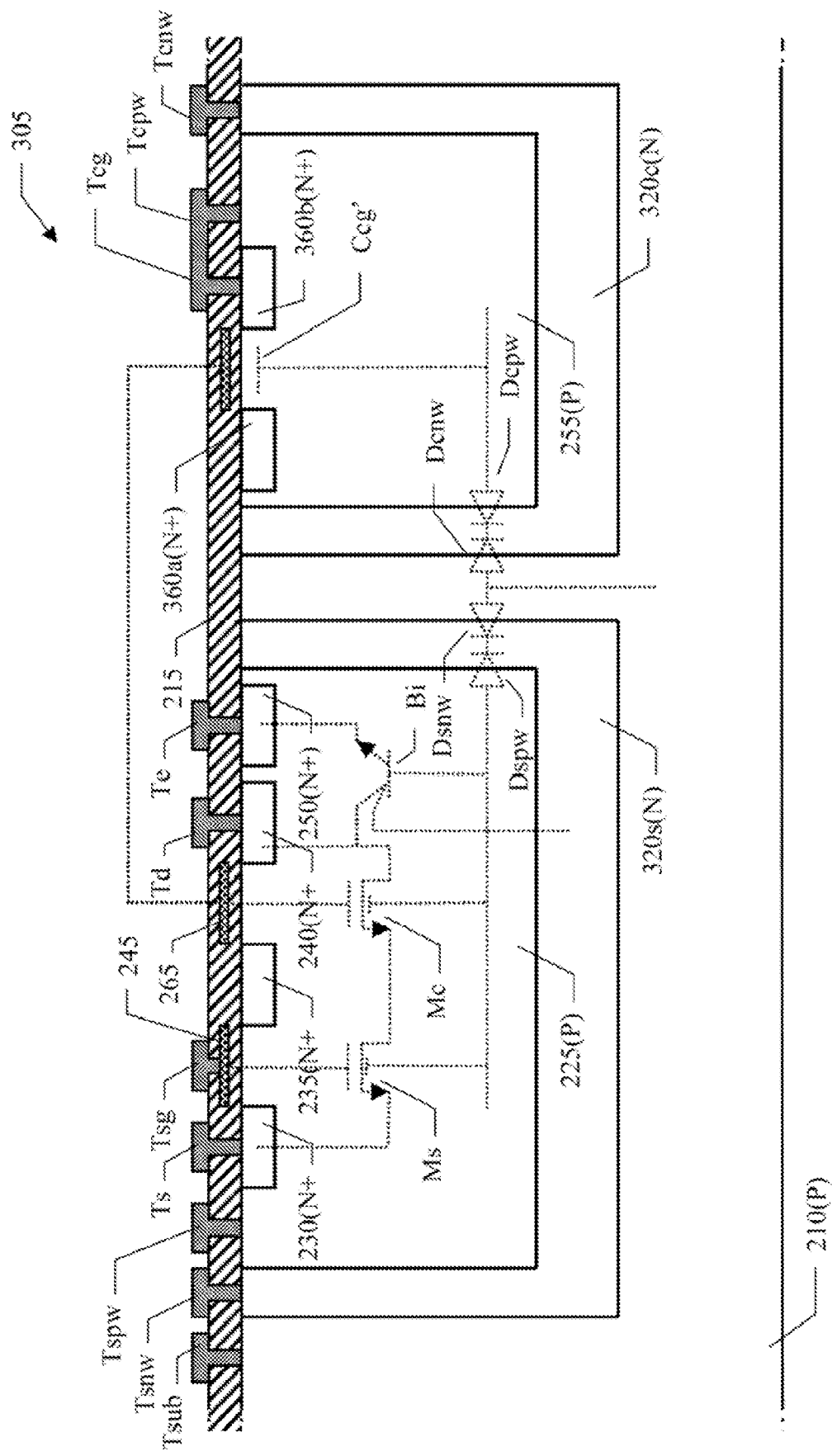
FIG. 3 is a cross-section view of a simplified implementation of another embodiment of a memory cell.

With reference now to FIG. 3, there is shown a cross-section view of a simplified implementation of another memory cell 305. In this case, the control gate of the storage transistor Mc is implemented by means of a MOS transistor (instead of the implanted capacitor described above).

More specifically, the memory cell 305 is now formed in two distinct N-wells extending into the P-substrate 210 from the front surface of the chip—i.e., a storage N-well 320s that includes the storage P-well 225 and a control N-well 320c that includes the control P-well 255; a conductive pad contacts the storage N-well 320s through a window of the insulating layer 215 so as to define a storage N-well terminal Tsnw, and another conductive pad contacts the control N-well 320c through a window of the insulating layer 215 so as to define a control N-well terminal Tcnw. The control section of the memory cell 305 now includes two N+ regions 360a and 360b, which extend into the control P-well 255 from the front surface of the chip at opposite sides of the polysilicon layer 265; both the N+ regions 360a and 360b (or at least one of them) are contacted by the terminal Tcg, which is short-circuited to the control P-well 255 (and then to the control P-well terminal Tcpw).

In this case, in an equivalent circuit of the memory cell 305 a MOS capacitor Ccg' is formed with the floating gate 265 by the control P-well 255, which then acts as control gate of the storage transistor Mc (again contacted by the control gate terminal Tcg short-circuited thereto). A diode Dsnw is now formed by the P-N junction between the P-substrate 210 and the storage N-well 320s; the diode Dsnw has an anode terminal (Tsub) and a cathode terminal that is coupled to the cathode terminal of the diode Dspw. Likewise, a diode Dcnw is formed by the P-N junction between the P-substrate 210 and the control N-well 320c; the diode Dcnw has an anode terminal (Tsub) and a cathode terminal that is coupled to the cathode terminal of the diode Dcpw.

The operation of the memory cell 305 is similar to the one described above. However, in this case two distinct (storage and control) N-wells 320s and 320c (which are properly biased so as to reverse bias the corresponding diodes Dsnw and Dcnw) are provided. Indeed, since the control P-well 255 is now always at the same voltage of the control gate terminal Tcg, during the programming operation, the control N-well 320c is biased to a high positive voltage (i.e., at least 6.5V in the example at issue) to ensure that the diode Dcpw is reverse biased; for this purpose, the control N-well terminal Tcnw is coupled to a charge pump (capable of providing the required high voltage). This is instead not possible for the storage N-well 320s; indeed, since the storage N-well 320s provides the high current required by the corresponding collector of the injection transistor Bi to program the memory cell 305, the N-well terminal Tsnw is coupled to a power supply terminal (providing a power supply voltage of the memory device).

Figure 4A:
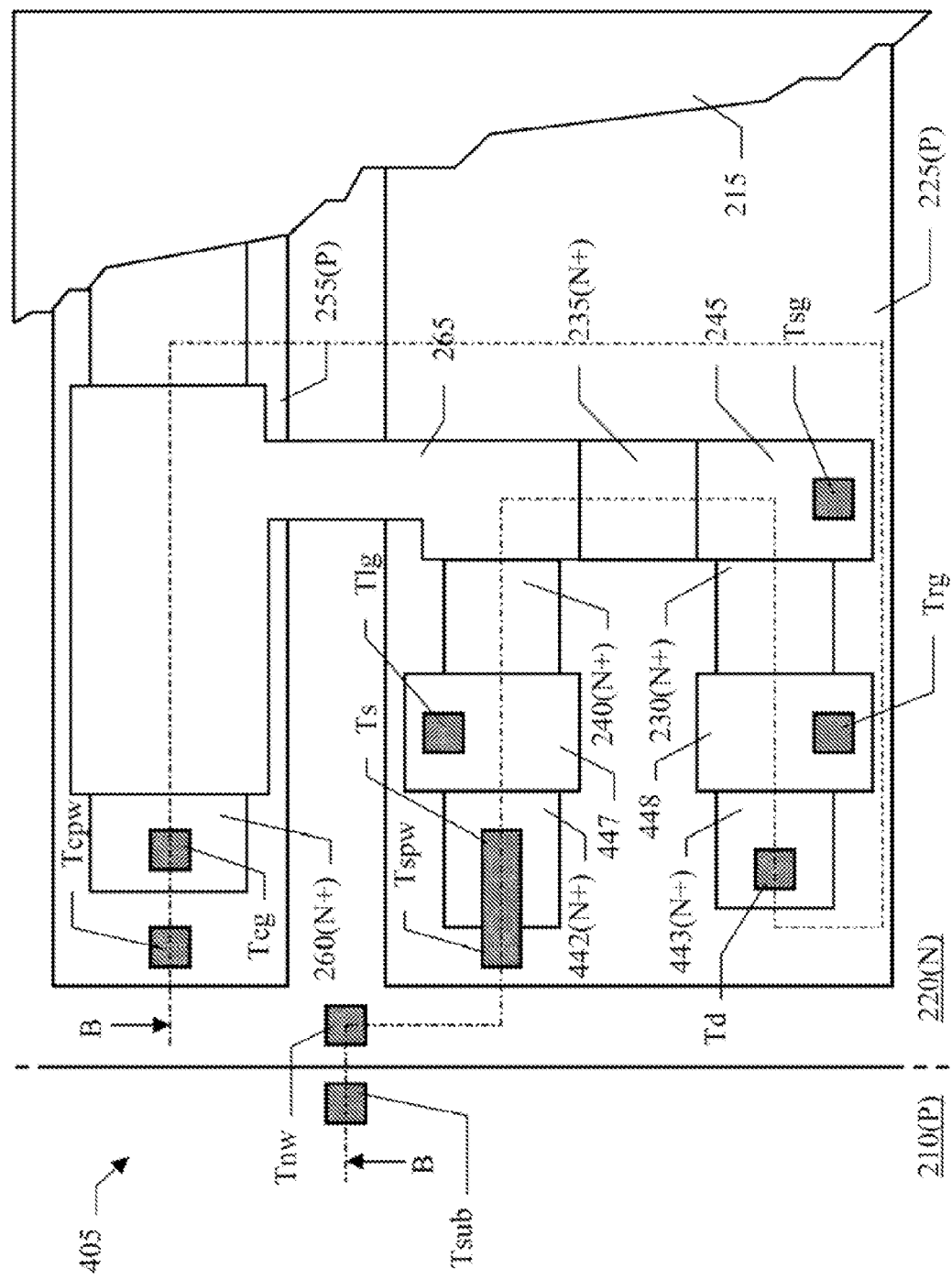
FIG. 4A-FIG. 4B show a simplified implementation of a memory cell according to an embodiment.
Figure 4B:
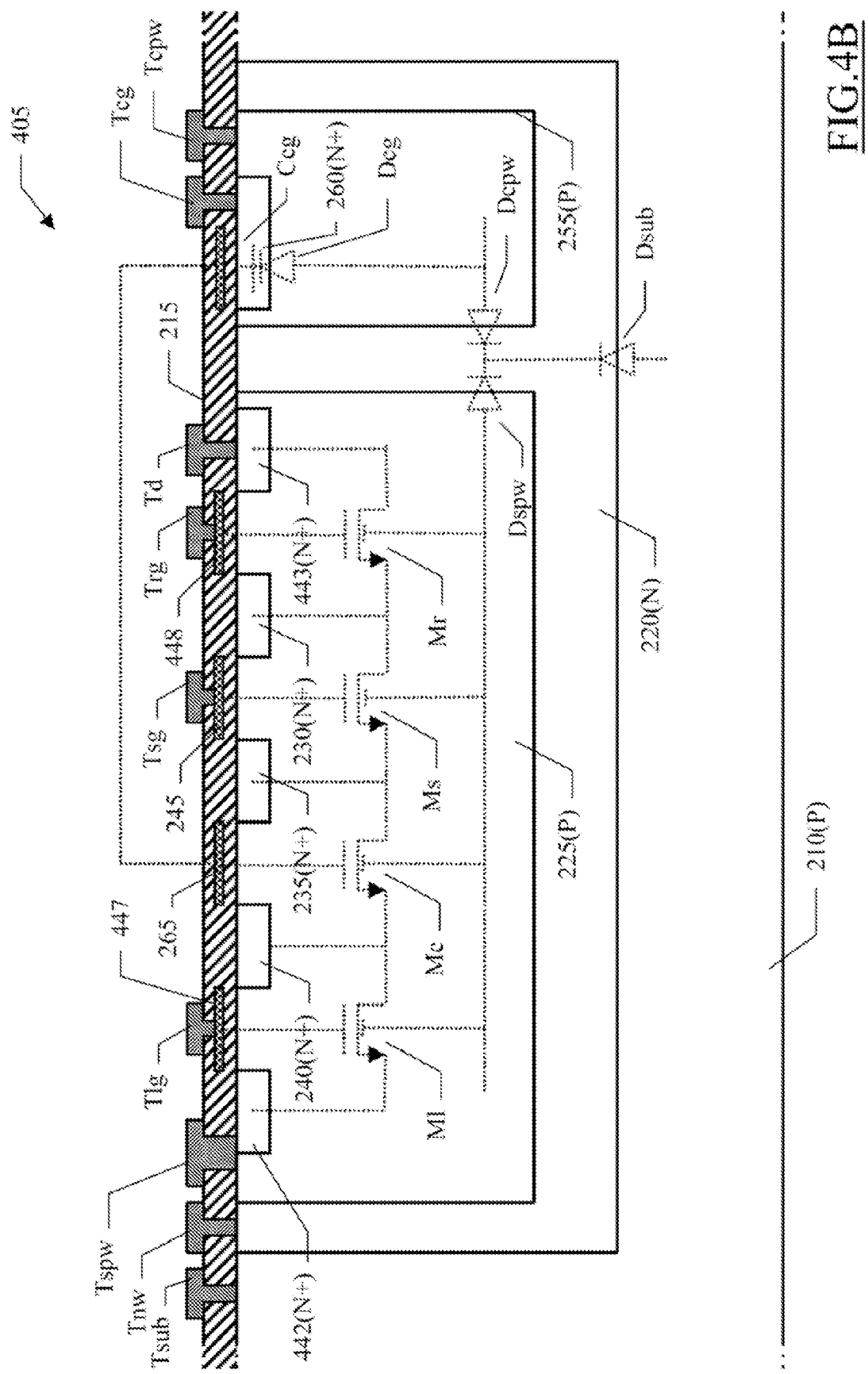

Moving to FIG. 4A-FIG. 4B, there is shown a simplified implementation of a generic memory cell 405 according to an embodiment; as above, FIG. 4A is a (partially cut away) top view illustrating a layout of the memory cell 405, whereas FIG. 4B is a cross-section view of the same memory cell 405 along the directrix B-B of FIG. 4A.

The control section of the memory cell 405 is the same as the one of the above-described emitter-FTP memory cell of FIG. 2B. Conversely, in the storage section of the memory cell 405, the emitter region and its emitter terminal have been removed (see references 250 and Te in FIG. 2A). The storage section of the memory cell 405 further includes an N+ region 442 that extends into the storage P-well 225 from the front surface of the chip beside the N+ region 240. The conductive pad defining the source terminal Ts is moved to contact the N+ region 442 (instead of the N+ region 230), and it is short-circuited to the storage P-well 225 (and then to the storage P-well terminal Tspw). The memory cell 405 further includes another N+ region 443 that extends into the storage P-well 225 from the front surface of the chip beside the N+ region 230. The conductive pad defining the drain terminal Td is moved to contact the N+ region 443 (instead of the N+ region 240). A polysilicon layer 447 extends over a channel region of the storage P-well 225 between the N+ region 442 and the N+ region 240 (being separated therefrom by a thin portion of the insulating layer 215); a conductive pad contacts the polysilicon layer 447 through a window of the insulating layer 215 so as to define a corresponding terminal Tlg. Likewise, a polysilicon layer 448 extends over a channel region of the storage P-well 225 between the N+ region 443 and the N+ region 230 (being separated therefrom by a thin portion of the insulating layer 215); a conductive pad contacts the polysilicon layer 448 through a window of the insulating layer 215 so as to define a corresponding terminal Trg.

Figure 4C:
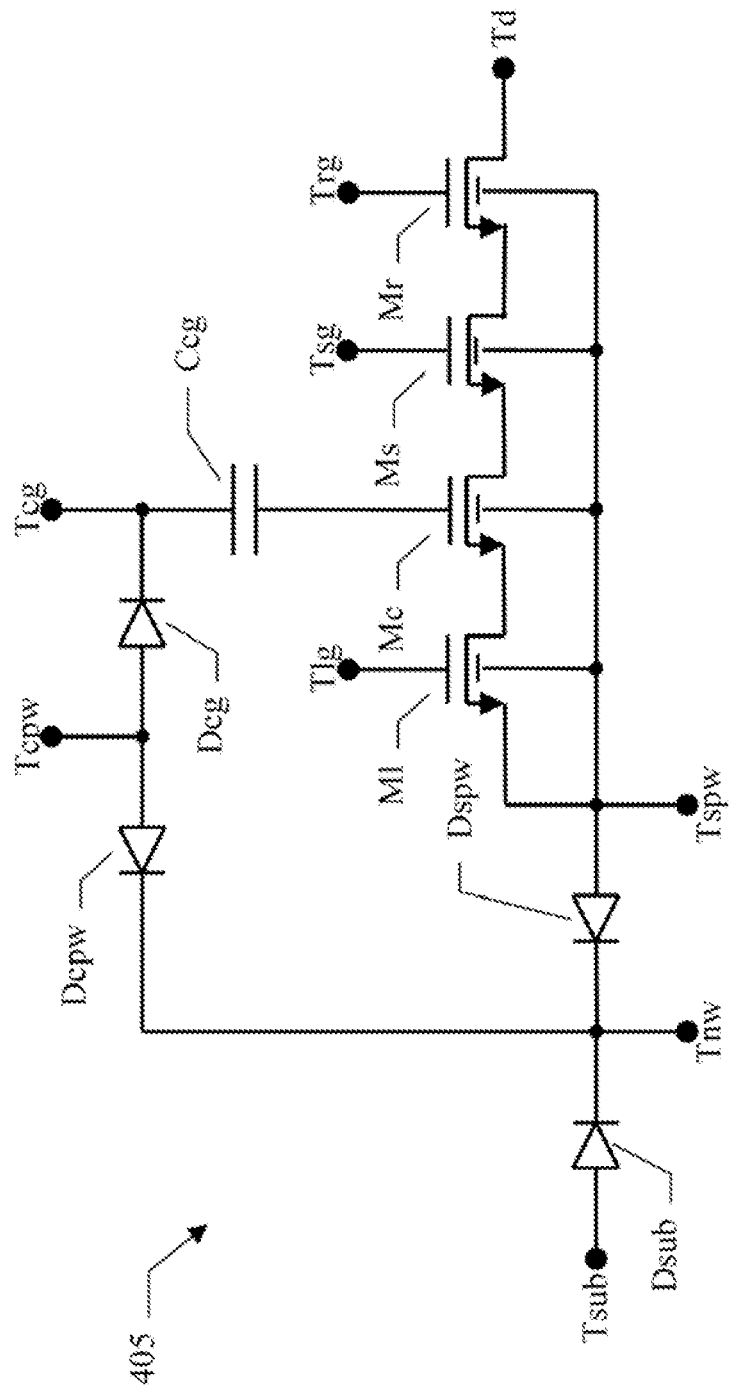
FIG. 4C is an equivalent circuit of this memory cell of FIGS. 4A-4B.

An equivalent circuit of this memory cell 405 is shown in FIG. 4C. Considering FIG. 4C together with FIG. 4B, in this case—with respect to the above-described emitter-FTP memory cell—no injection transistor is present (see reference Bi in FIG. 2B). The memory cell 405 further includes an N-MOS (selection) left transistor Ml and an N-MOS (selection) right transistor Mr, which are formed in the same body defined by the storage P-well 225 (as the selection transistor Ms and the storage transistor Mc). Particularly, the left transistor Ml is defined by the N+ region 443 (source), the N+ region 240 (drain), and the polysilicon layer 447 (gate); likewise, the right transistor Mr is defined by the N+ region 230 (source), the N+ region 443 (drain), and the polysilicon layer 448 (gate). The left transistor Ml has a source terminal that is coupled to the storage P-well terminal Tspw, a left gate terminal (Tlg), and a drain terminal that is coupled to source terminal of the storage transistor Mc; on the other hand, the right transistor Mr has a source terminal that is coupled to the drain terminal of the selection transistor Ms, a right gate terminal (Trg), and a drain terminal (Td).

Figure 4D:
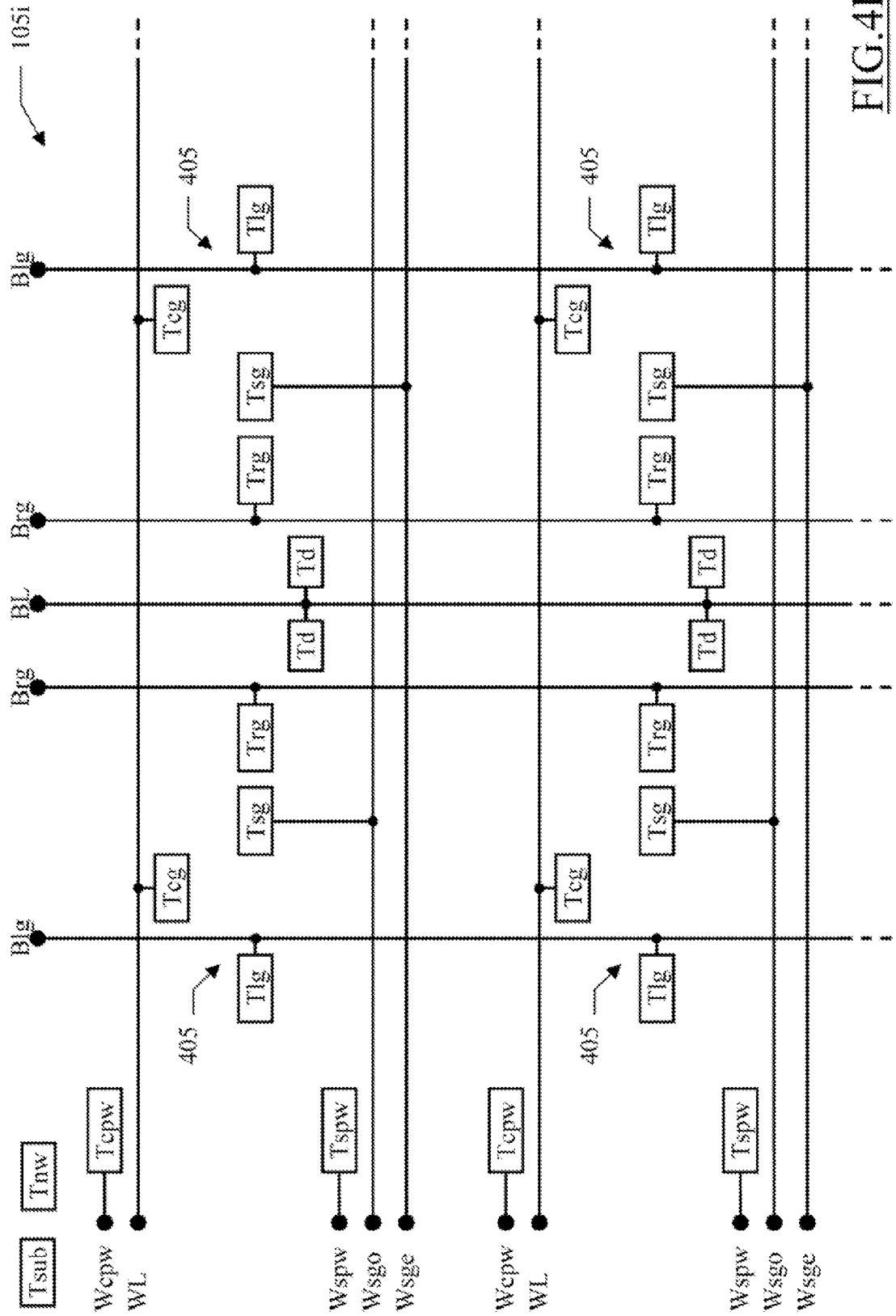
FIG. 4D shows a conceptual representation of an architecture according to an embodiment of a memory device based on the memory cell of FIGS. 4A-4C, FIG. 4E-FIG. 4G show the biasing of an embodiment of the memory cell of FIGS. 4A-4D during a programming operation, an erasing operation, and a reading operation, respectively.

A conceptual representation of an embodiment of the architecture of the memory device based on this memory cell 405 is shown in FIG. 4D. Considering FIG. 4D together with FIG. 4C, in the memory matrix (denoted with the reference 105i) the common P-substrate terminal Tsub is again biased to the lowest voltage that is available in the memory device (for example, −7V), so as to reverse bias the diode Dsub (and then insulate the N-well). However, in this case—with respect to the above-described emitter-FTP memory device—no emitter line is present (see reference We in FIG. 2D). Each pair of odd and even adjacent memory cells 405 in the same row are coupled to a common bit line BL; for this purpose, the memory cells 405 of the pair are symmetric about the bit line BL, with a single drain region that is shared between their right transistors Mr. Moreover, two selection gate lines are now provided for each row: an odd selection gate line Wsgo is coupled to the selection gate terminals Tsg of all the memory cells 405 in the odd columns, while an even selection gate line Wsge is coupled to the selection gate terminals Tsg of all the memory cells 405 in the even columns. The left gate terminals Tlg and the right gate terminals Trg of all the memory cells 405 of each column are coupled to a corresponding left gate line Blg and right gate line Brg, respectively; both the lines Blg and Brg are driven by the column decoder.

As described in detail in the following, the left transistor Ml and the right transistor Mr are used to select the memory cell 405 to be programmed along the corresponding row. The selection transistor Ms (in addition to selecting the memory cell 405 to be read along the corresponding column) is now also used—by means of the two distinct odd and even selection gate lines Wsgo, Wsge—to select the memory cell 405 to be read in the corresponding pair coupled to the same bit line BL in the corresponding row.

Figure 4E:
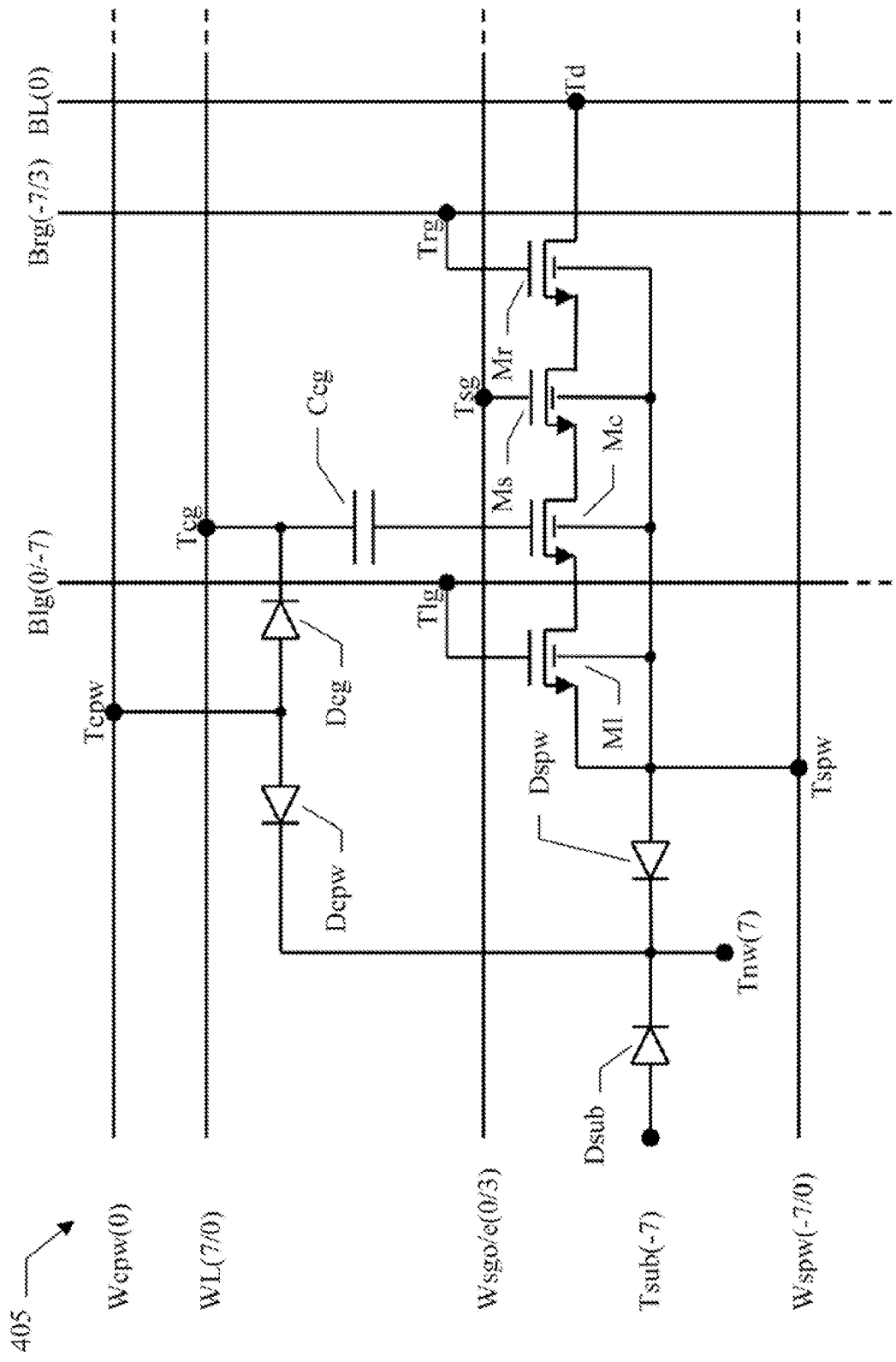

Particularly, with reference to FIG. 4E together with FIG. 4D, the memory device is now programmed by Fowler-Nordheim effect. For this purpose, during a programming operation of a selected memory cell 405 (of a page in a corresponding row), all the bit lines BL (and then all the drain terminals Td) are biased to ground. The word line WL of the selected memory cell 405 (and then its control gate terminal Tcg) is biased to a very high positive voltage (for example, 7V), while the other word lines WL are biased to ground. At the same time, the storage P-well line Wspw of the selected memory cell 405 is biased to a very high negative voltage (for example, opposite the one of its word line WL—i.e., −7V), while the other storage P-well lines Wspw are biased to ground. The left gate line Blg of the selected memory cell 405 is biased to ground, while the other left gate lines Blg are biased to the same voltage of −7V. On the other hand, the right gate line Brg of the selected memory cell 405 is biased to the same voltage of −7V, while the other right gate lines Brg are biased to a low positive voltage (for example, 3V). Moreover, the odd or even selection gate line Wsgo, Wsge of the selected memory cell 405 is biased to ground, while the other odd and even selection gate lines Wsgo, Wsge (in the same row and in the other rows) are biased to the same voltage of 3V. All the control P-well lines Wcpw are biased to ground, and the common N-well terminal Tnw is biased to the same voltage of 7V.

In this way, all the diodes Dspw, Dcpw and Dcg are reverse biased. The selected memory cell 405 is enabled by the voltage at its control gate (7V), which is transferred to the floating gate of the storage transistor Mc by capacitive coupling, and by the voltage at the storage P-well (−7V). At the same time, the left transistor Ml is switched on, so as to transfer the voltage at the storage P-well to the source of the storage transistor Mc; conversely, the right transistor Mr is switched off, so as to insulate the storage transistor Mc from the drain terminal Td. Therefore, the very high electric field defined by the potential difference between the floating gate (7V) and the body (−7V) of the storage transistor Mc generates a Fowler-Nordheim current, which injects electrons into its floating gate (for a time sufficient to ensure that all the selected memory cells 405 are programmed—for example, 150-300 μs).

Conversely, each other (unselected) memory cell 405 of the same row of the selected memory cell 405 receives the same voltages of 7V at the control gate terminal Tcg and of −7V at the storage P-well terminal Tspw. However, the left transistor Ml is switched off, and both the selection transistor Ms and the right transistor Mr are switched on; in this way, the voltage of 0V is applied by the drain terminal Td to an N-channel being created by charge inversion in the body of the storage P-well under the floating gate. Therefore, the electric field defined by the potential difference between the floating gate (7V) and the body (0V) of the storage transistor Mc is halved, and then unable to program the unselected memory cell 405. In each other unselected memory cell 405, both the control gate terminal Tcg and the storage P-well terminal Tspw are at ground, so that the biasing of the storage transistor Mc is unable to inject electrons into the corresponding floating gate.

Figure 4F:
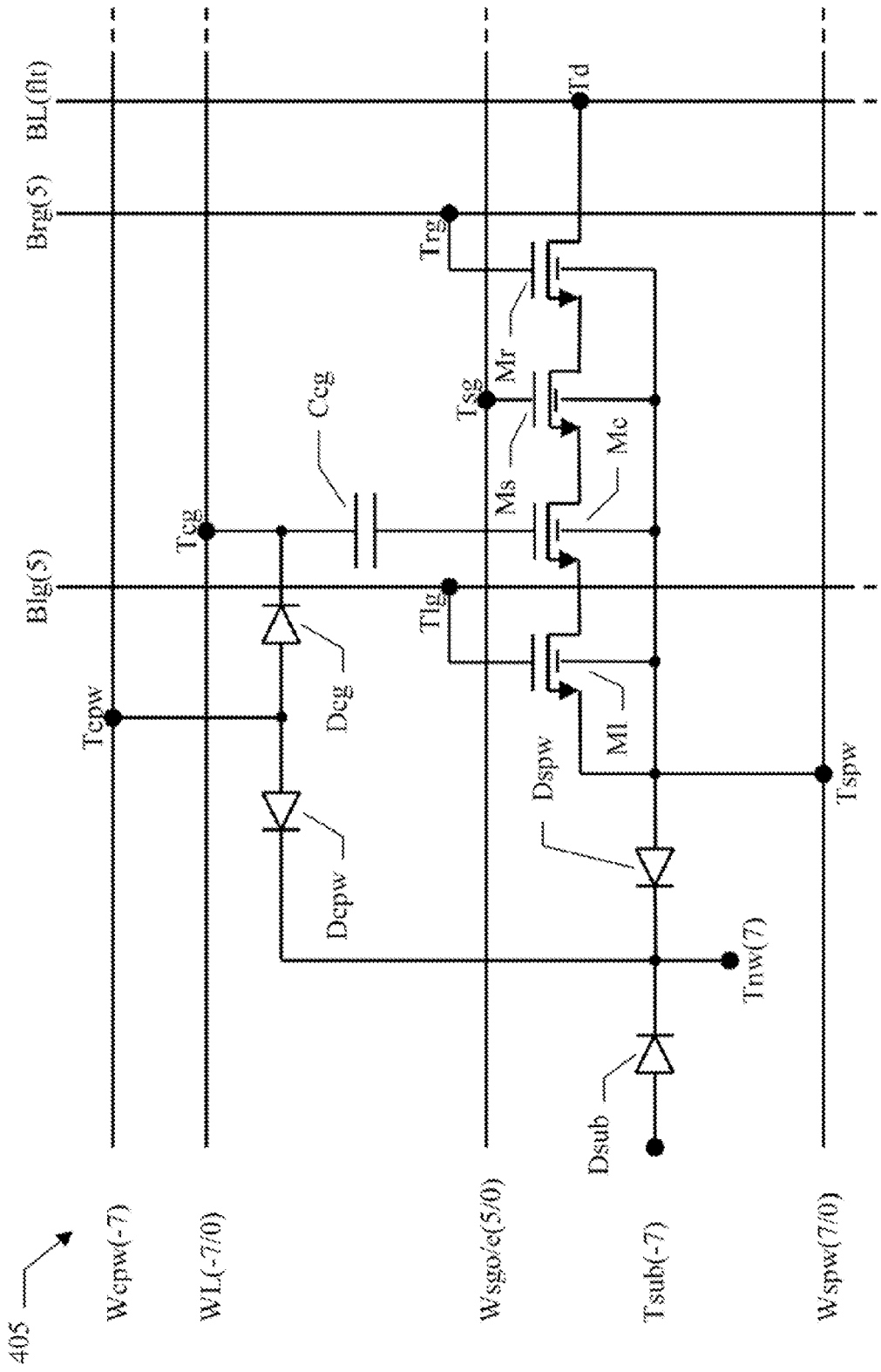

As shown in FIG. 4F together with FIG. 4D, the memory device is again erased by Fowler-Nordheim effect at the sector level. For this purpose, during an erasing operation of a selected sector, all the bit lines BL (and then all the drain terminals Td) are left floating. The word line WL of the selected sector (and then the control gate terminals Tcg of its memory cells 405) is biased to a very high negative voltage (for example, −7V), while the other word lines WL are biased to ground. At the same time, the storage P-well line Wspw of the selected sector is biased to a very high positive voltage (for example, opposite the one of its word line WL—i.e., 7V), while the other storage P-well lines Wspw are biased to ground. All the left gate lines Blg and all the right gate lines Brg are biased to a high positive voltage (for example, 5V). The odd and even selection gate lines Wsgo, Wsge of the selected sector are biased to the same voltage of 5V, while the other odd and even selection gate lines Wsgo, Wsge are biased to ground. Moreover, all the control P-well lines Wcpw are biased to the same voltage of −7V, and the common N-well terminal Tnw is biased to the same voltage of 7V.

In this way, all the diodes Dspw, Dcpw and Dcg are reverse biased. Each memory cell 405 of the selected sector is enabled by the voltage at its control gate (−7V), which is transferred to the floating gate of the storage transistor Mc by capacitive coupling, and by the voltage at the storage P-well (7V), which is directly applied to the body of the storage transistor Mc (with the voltage of 5V at the left gate Tlg, selection gate Tsg, and right gate Trg that reduces the electric stress on the corresponding transistors Ml, Ms, and Mr). Therefore, the very high electric field defined by the potential difference between the floating gate (−7V) and the body (7V) of the storage transistor Mc generates a Fowler-Nordheim current, which now extracts the electrons from its floating gate (for a time sufficient to ensure that all the memory cells 405 of the selected sector are erased). In this case it may not be possible to use the bit lines BL to reduce the potential difference between the floating gate and the body of each storage transistor Mc selectively (like in the programming operation described above), since no N-channel is now formed in the body of the storage transistor Mc so that any voltage at the drain terminal Td would be unable to change its biasing.

Conversely, in each (unselected) memory cell 405 of the other sectors no electric field is defined between the floating gate and the body of the storage transistor Mc (since they are both at ground), so that no electrons are extracted from its floating gate. Moreover, the selection transistor Ms (and then the right transistor Mr as well) is switched off; therefore, these transistors Ms, Mr filter the propagation of the voltage of the storage P-well of the selected sector (5V) to the storage P-well of each unselected memory cell 405 (thereby limiting its electric stress and then the consequent loss of electrons in its floating gate).

Figure 4G:
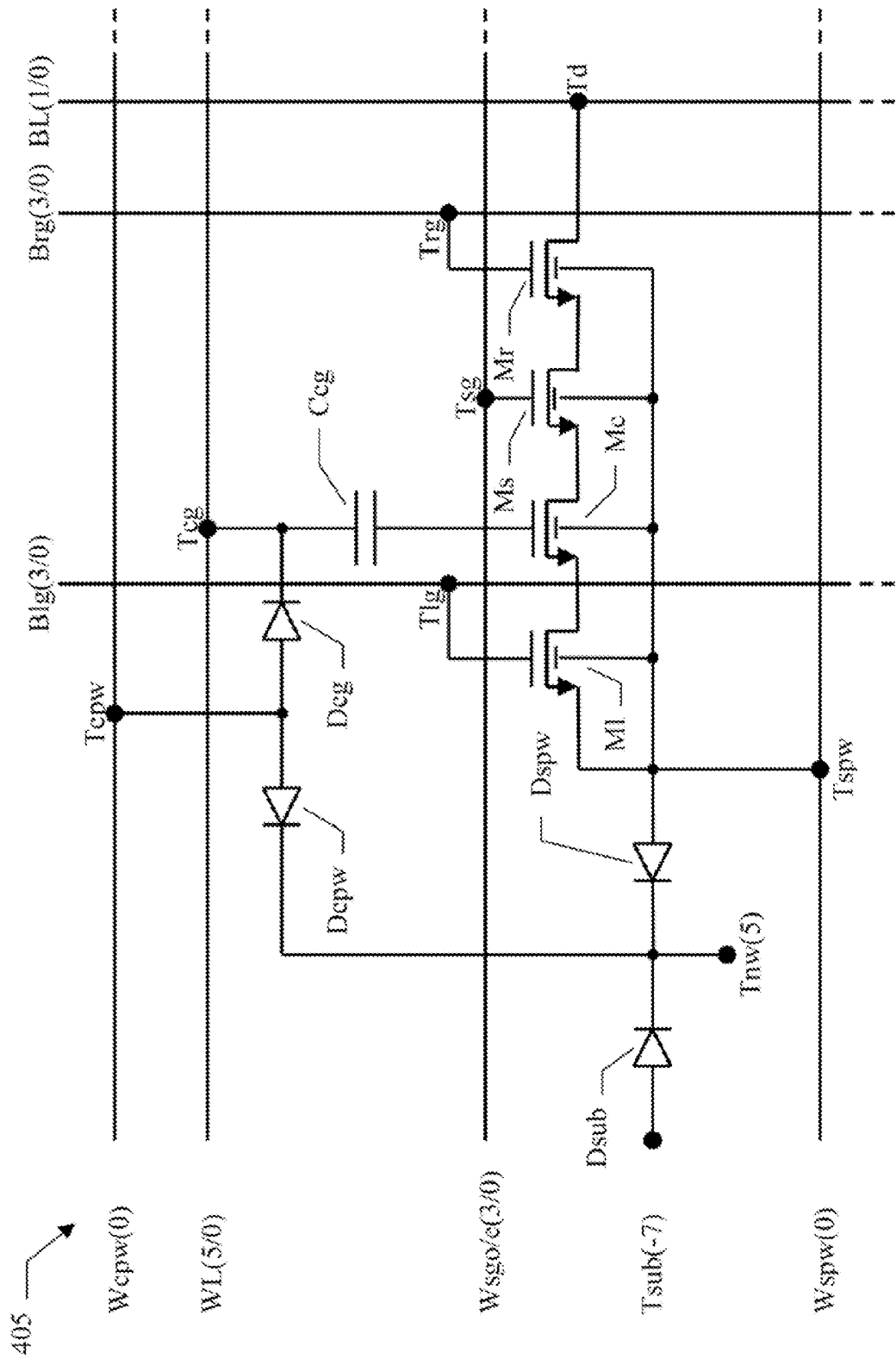

At the end, during a reading operation of a selected memory cell 405 (of a page in a corresponding row), as shown in FIG. 4G together with FIG. 4D, the word line WL of the selected memory cell 405 (and then its control gate terminal Tcg) is biased to a high positive voltage (for example, 5V), while the other word lines WL are biased to ground. At the same time, the bit line BL of the selected memory cell 405 (and then its drain terminal Td) is biased to a very low positive voltage (for example, 1V), while the other bit lines BL are biased to ground. The left gate line Blg and the right gate line Brg of the selected memory cell 405 are biased to a low positive voltage (for example, 3V), while the other left gate lines Blg and right gate lines Brg are biased to ground. Moreover, the odd or even selection gate line Wsgo,Wsge of the selected memory cell 405 is biased to the same voltage of 3V, while the other odd and even selection gate lines Wsgo,Wsge (in the same row and in the other rows) are biased to ground. All the storage P-well lines Wspw and all the control P-well lines Wcpw are biased to ground, and the common N-well terminal Tnw is biased to the same voltage of 5V.

In this way, all the diodes Dspw, Dcpw and Dcg are reverse biased. Each selected memory cell 405 is enabled by the voltage at the gate terminal Tcg of the storage transistor Mc (5V), which is transferred to its floating gate by capacitive coupling, and by the voltage at its drain terminal Td (1V); at the same time, the left transistor Ml is switched on (so as to bring the source of the storage transistor Mc to ground), and both the selection transistor Ms and the right transistor Mr are switched on (so as to connect the drain of the storage transistor Mc to the bit line BL). As above, if the selected memory cell 405 is erased its storage transistor Mc (with low threshold voltage) is switched on by the potential difference between the floating gate (5V) and the source (0V), and a current flows through the corresponding bit line BL so that the logic value 1 is read. On the other hand, if the selected memory cell 405 is programmed its storage transistor Mc (with high threshold voltage) is switched off and no current flows through the corresponding bit line BL, so that the logic value 0 is read.

Conversely, in the (unselected) memory cell 405 in the same row of the selected memory cell 405 that is coupled to the same bit line BL, the selection transistor Ms is switched off; likewise, in each unselected memory cell 405 of the same column of the selected memory cell 405 all the transistors Ml, Ms and Mr are switched off. Therefore, no current can flow through the storage transistor Mc of each one of these unselected memory cells 405, even when they are depleted. In each one of the other unselected memory cells 405, the storage transistor Mc is always switched off (and the corresponding bit line BL is discoupled from the read/write unit).

Naturally, in this case may not be possible to read the memory cells 405 on the same row that share the same bit line BL concurrently; therefore, all the memory cells 405 of each page are always coupled to the same (odd or even) selection gate line Wsgo,Wsge.

The above-described embodiment strongly reduces the currents that are used during the programming operation (since it in now implemented by Fowler-Nordheim effect). As a result, the charge pumps of the memory device may be simplified, with a corresponding reduction of their size. Particularly, in this case it may be possible to use voltages that are symmetric (with respect to ground), with a beneficial impact on the structure of the charge pumps. Moreover, the low currents that are used during the programming operation accordingly reduce the power consumption of the memory device. In this way, it also may be possible to have a higher programming parallelism of the memory device (for example, 16-32 bits).

Naturally, the programming of the memory cells by Fowler-Nordheim effect may be slower than their programming by SHE injection (as in conventional emitter-FTP memory cells); however, this may be compensated for by the higher programming parallelism of the proposed memory device, so that its overall programming speed remains comparable to the one of the emitter-FTP memory devices.

Moreover, in an embodiment the filtering action of the selection transistor and the right transistor limits the propagation of the voltage at the storage P-well of the selected sector to the unselected memory cells during the erasing operation. This reduces the electric stress on the unselected memory cells (and then the loss of electrons from the floating gates of their storage transistors), with a beneficial effect on the data retention of the memory device. In this way, the proposed memory device may withstand a higher number of erasing operations—being comparable to the ones of the E$^2$PROMs (for example, of the order of approximately 100,000-200,000).

An embodiment of the proposed memory cell adds the left transistor and the right transistor (to the structure of the emitter-FTP memory cell), but it removes the emitter region of the injection transistor; therefore, the resulting increase of the size of the memory cell is limited. Particularly, in the embodiment described above—wherein each pair of memory cells shares the same drain region of the right transistors—the size of the memory cell remains substantially the same as the emitter-FTP memory cell. All of the above may make it possible to produce the memory device with a capacity comparable to the one of the E$^2$PROMs (i.e., of the order of a few Kbytes).

Figure 5:
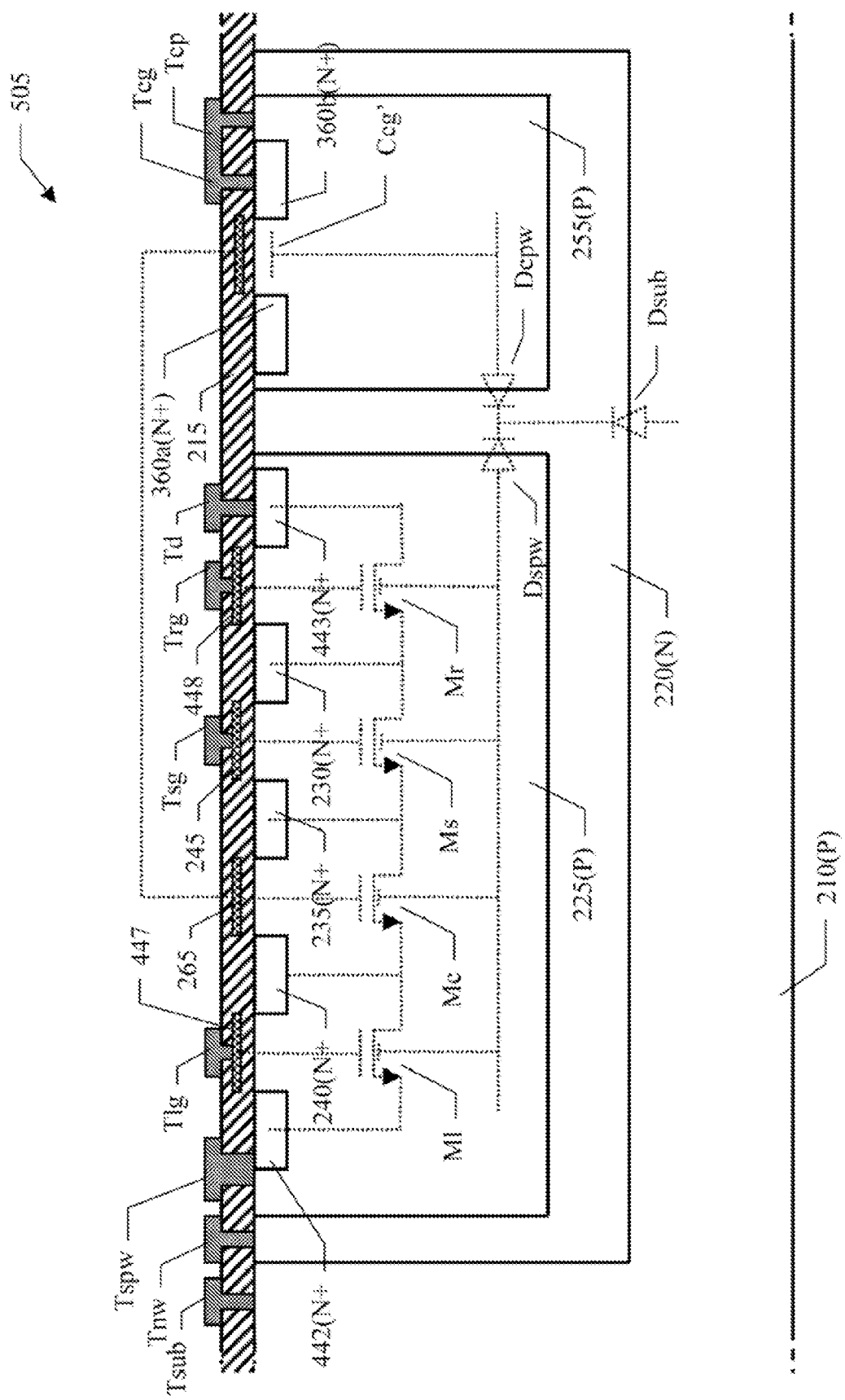
FIG. 5 is a cross-section view of a simplified implementation of a memory cell according to another embodiment.

With reference now to FIG. 5, there is shown a cross-section view of a simplified implementation of another memory cell 505 according to an embodiment. The control gate of the storage transistor Mc is now implemented by means of the MOS transistor being formed by the N+ regions 360a and 360b, with the capacitor Ccg' that is directly coupled to the anode of the diode Dcpw.

Nevertheless, in this case it may still be possible to form all the memory cells in the common N-well 220. Indeed, during the programming operation the N-well 220 may now be biased to the high positive voltage (i.e., 7V in the example at issue) to ensure that the diode Dsub is reverse biased. Since no current flows through the N-well 220, the N-well terminal Tnw may be coupled to a charge pump providing this voltage.

Figure 6:
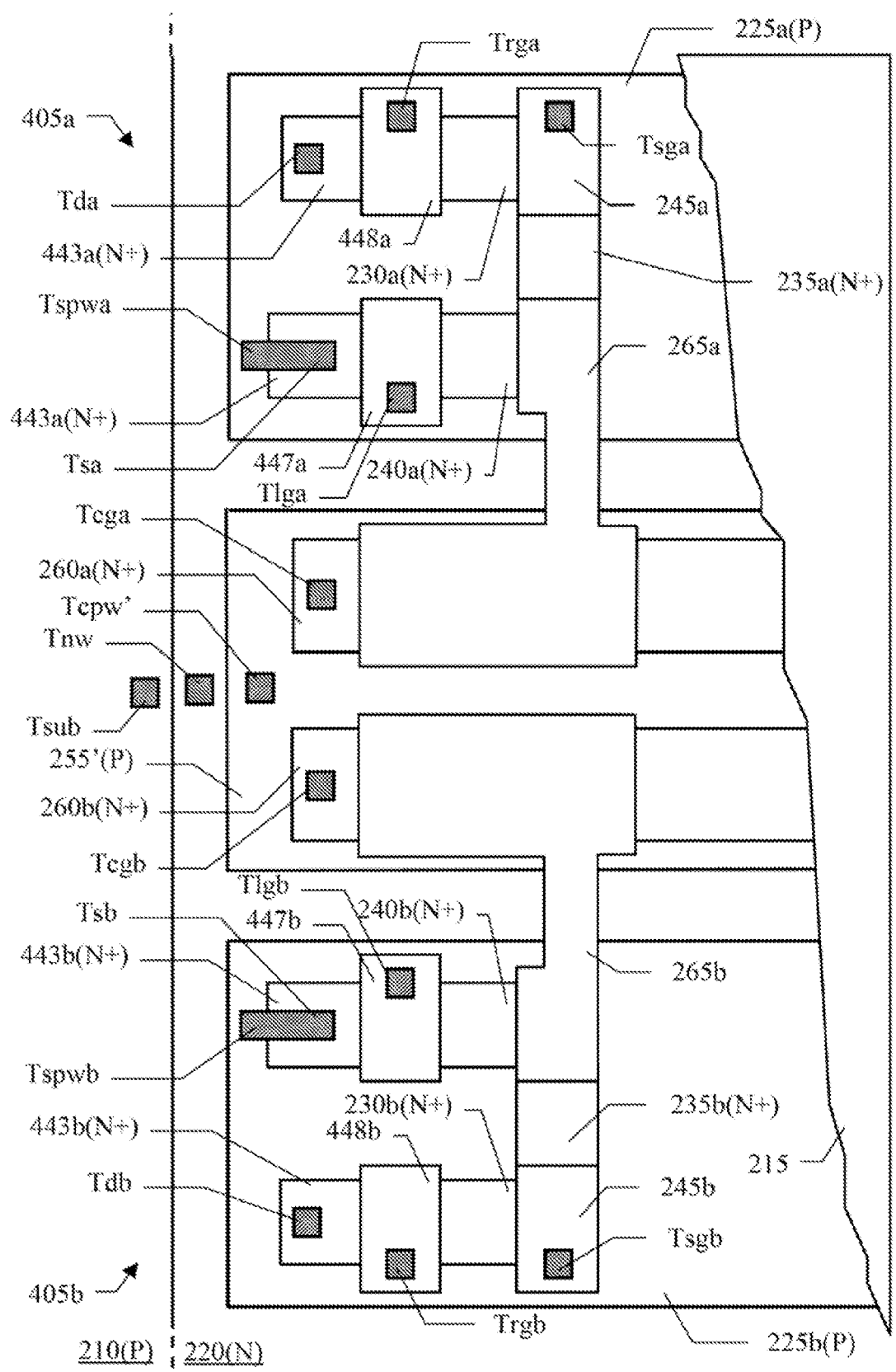
FIG. 6 is a schematic representation of the organization of a memory matrix according to a further embodiment.

Moving to FIG. 6, there is shown a schematic representation of the organization of the memory matrix (denoted with the reference 105i') according to a further embodiment. Particularly, the memory cells (based on the implanted capacitors, wherein the control gates are insulated from the control P-wells) are now grouped in pairs of adjacent rows. The memory cells of each pair of rows (differentiated with the addition of a suffix "a" and "b", respectively) are symmetric with respect to a row direction (i.e., horizontally in the figure). The memory cells 405a,405b of the pair of rows then share a common control P-well with the corresponding terminal (denoted with 255' and Tcpw', respectively)—wherein both the N+ region 260a and the N+ region 260b are formed. Indeed, the control P-well 255' (being insulated from the control gates terminals Tcga,Tcgb in this structure based on the implanted capacitors) is biased to the same voltage during the different operations on the memory device (i.e., programming, erasing and reading) for both the selected memory cells 405a,405b and the unselected memory cells 405a,405b (see FIG. 4E-FIG. 4G). Therefore, the control sections of all the memory cells of the memory matrix 105i' might be formed in a common control P-well; however, because of routing problems, it may be preferable to provide a distinct control P-well 255' for the memory cells 405a, 450b of each pair of rows (with all the control P-well terminals Tcpw' of the memory matrix 105i' that may be coupled together).

The above-described structure of the memory matrix 105i' may further reduces the size of the memory device as a whole.

Naturally, in order to satisfy local and specific requirements, a person skilled in the art may apply to the embodiments described above many logical and/or physical modifications and alterations. More specifically, although embodiments have been described with a certain degree of particularity, it is understood that omissions, substitutions and changes in the form and details as well as other embodiments are possible. Particularly, different embodiments may even be practiced without the specific details (such as the numerical examples) set forth in the preceding description to provide a more thorough understanding thereof; conversely, well-known features may have been omitted or simplified in order not to obscure the description with unnecessary particulars. Moreover, it is expressly intended that specific elements and/or method steps described in connection with any embodiment of the disclosed solution may be incorporated in any other embodiment as a matter of general design choice.

For example, similar considerations apply if the memory device has a different structure or includes equivalent components (either separate to each other or combined together, in whole or in part); moreover, the memory device may have different operative characteristics.

In addition, the regions of the N-type may be replaced by regions of the P-type, and vice-versa (so as to obtain a memory device based on transistors of the P-MOS type); particularly, when the substrate remains of the P-type, it is also possible to form the storage wells and the control wells (of the N-type) directly in the substrate without the above-described triple-well structure. Alternatively, each memory cell may store a different logic value (for example, two or more bits).

The above-mentioned layout is merely illustrative and in no way limitative (with the different regions of each memory cell that may be arranged in any other way—for example, aligned to each other). Similar considerations apply to the architecture of the memory device. For example, in order to increase the reliability of the memory device, each logic value may be stored in a pair of memory cells (associated with the same address): a direct cell stores the actual logic value, and a complementary cell stores its opposite value. During a reading operation, both the direct cell and the complementary cell are read. If the direct cell is programmed and the complementary cell is erased, the logic value 0 is read; conversely, if the direct cell is erased and the complementary cell is programmed, the logic value 1 is read. Instead, when the direct cell and the complementary cell are both programmed or both erased, an error condition is reported.

Voltages of any other value may be used to cause the injection of electric charge (i.e., electrons for N-MOS transistors and holes for P-MOS transistors) into the floating gates of the memory cells to be programmed, and to inhibit such injection in the other memory cells.

Nothing prevents inverting the positions of the selection transistor and the right transistor (i.e., with the source of the right transistor coupled to the drain of the storage transistor, and the drain of the selection transistor coupled to the bit line). In any case, an implementation without the selection transistor (with a procedure for restoring the depleted memory cells after each erasing operation) is not excluded; moreover, it may also be possible to remove the right transistor (with a corresponding reduction of size of the memory cell, but a worsening of its data retention).

Naturally, the rows and columns of the memory matrix are merely topological concepts, which are not bound to any specific geometric arrangement.

A basic implementation wherein a distinct bit line is provided for each column of memory cells is feasible.

The above-mentioned voltages being used during the programming, erasing and reading operations are merely illustrative and they are not to be interpreted in a limitative manner. Indeed, the voltages may vary according to the structure of the memory device (and particularly a thickness of its insulating layer); moreover, dual considerations apply if the memory device is implemented with P-MOS transistors. More generally, the programming voltages and the erasing voltages may differ from each other; moreover, the use of symmetric voltages is not necessary.

The possibility of forming the control sections of a different number of memory cells (based on implanted capacitors) in the same control P-well is not excluded.

Likewise, nothing prevents providing multiple N-wells (for example, each one for a predefined subset of rows of memory cells).

Similar considerations apply if the memory device is programmed, erased and/or read with equivalent procedures (by using similar steps, removing some steps being non-essential, or adding further optional steps).

The memory device may be produced with other production processes (for example, of the smart power, analog, or high voltage type). It is readily apparent that an embodiment of a memory described above might be part of the design of an integrated circuit. The design may also be created in a programming language; moreover, if the designer does not fabricate chips or masks, the design may be transmitted by physical means to others. In any case, the resulting integrated circuit may be distributed by its manufacturer in raw wafer form, as a bare die, or in packages.

Moreover, the proposed structure may be integrated with other circuits in the same chip; the chip may also be coupled with one or more other chips (such as a processor), or it may be mounted in intermediate products (such as mother boards). In any case, the memory device is suitable to be used in complex systems (such as mobile telephone).

From the foregoing it will be appreciated that, although specific embodiments have been described herein for purposes of illustration, various modifications may be made without deviating from the spirit and scope of the disclosure. Furthermore, where an alternative is disclosed for a particular embodiment, this alternative may also apply to other embodiments even if not specifically stated.

The invention claimed is:

1. A non-volatile memory device integrated in a chip of semiconductor material, the memory device comprising:
   a plurality of memory cells, each one including a first well and a second well of a first type of conductivity being formed in an insulating region of a second type of conductivity;
   a first, a second, a third and a fourth region of the second type of conductivity being formed in the first well for defining a sequence of a first selection transistor of MOS type;
   a storage transistor of floating gate MOS type; and
   a second selection transistor of MOS type being coupled in series, the first region being short-circuited to the first well, a first gate of the first selection transistor, a second gate of the second selection transistor, a floating gate of the storage transistor, and a control gate of the storage transistor formed in the second well, the control gate being capacitively coupled with the floating gate.

2. The memory device according to claim 1, further comprising:
  means for applying a first voltage to the control gates and a second voltage to the first wells of a subset of the memory cells including at least one memory cell to be programmed, a difference between the first voltage and the second voltage being capable of injecting electric charge into the floating gate of each memory cell to be programmed; and
  means for selectively applying a third voltage comprised between the first voltage and the second voltage to the storage transistor of each memory cell of the subset not to be programmed through the corresponding second selection transistor, a difference between the first voltage and the third voltage inhibiting the injection of electric charge into the corresponding floating gate.

3. The memory device according to claim 2, wherein each memory cell further includes a fifth region of the second type of conductivity formed in the first well for defining a third selection transistor of MOS type coupled in series to the second selection transistor, and a third gate of the third selection transistor.

4. The memory device according to claim 3, wherein the memory cells are arranged in a matrix with a plurality of rows and a plurality of columns, the memory cells of each row sharing a common first well and a common second well, and
  wherein the memory device further includes a plurality of first well lines each one coupled to the first well of a corresponding row, a plurality of second well lines each one coupled to the second well of a corresponding row, a plurality of word lines each one coupled to the control gates of the memory cells of a corresponding row, a plurality of first selection lines each one coupled to the first gates of the memory cells of a corresponding line, a plurality of second selection lines each one coupled to the second gates of the memory cells of a corresponding line, a plurality of sets of third selection lines each one coupled to the third gates of the memory cells of a corresponding row, and a plurality of bit lines each one coupled to a boundary one of the fourth and fifth regions of the memory cells of a corresponding line.

5. The memory device according to claim 4, wherein the memory cells of each row are grouped in pairs of adjacent memory cells sharing a common boundary region, each set of third selection lines including an odd third selection line and an even third selection line each one coupled alternatively to the third gates of the memory cells of the corresponding row, the third gates of the memory cells of each pair of adjacent memory cells being coupled to different odd and even third selection lines.

6. The memory device according to claim 4, further comprising:
  programming means, wherein during a programming operation of a set of selected memory cells of a common row, the programming means applying a reference voltage to all the bit lines, applying a programming voltage of a first sign with respect to the reference voltage to the word line of the selected memory cells and the reference voltage to the other word lines, applying a further programming voltage of a second sign with respect to the reference voltage to the first well line of the selected memory cells and the reference voltage to the other first well lines, and biasing the first, second and third selection lines to switch off at least one of the second and third selection transistors of each selected memory cell and to switch on both the second and third selection transistors of the other memory cells.

7. The memory device according to claim 6, further comprising:
  erasing means, wherein during an erasing operation of all the memory cells of a selected row the erasing means leaving all the bit lines floating, applying an erasing voltage of the second sign to the word line of the selected row and the reference voltage to the other word lines, and applying a further erasing voltage of the first sign to the first well line of the selected row and the reference voltage to the other first well lines.

8. The memory device according to claim 7, further comprising:
  reading means, wherein during a reading operation of a set of further selected memory cells of a common row the reading means applying a reading voltage to the word line of the further selected memory cells and the reference voltage to the other word lines, applying a further reading voltage comprised between the reading voltage and the reference voltage to the bit lines of the further selected memory cells and the reference voltage to the other bit lines, applying the reference voltage to all the first well lines, and biasing the first, second and third selection lines to switch on the first, second and third selection transistors of each further selected memory cell and to switch off at least one of the first, second and third selection transistor of the other memory cells.

9. The memory device according to claim 4, wherein each memory cell includes a sixth region of the second type of conductivity formed in the second well in front of the floating gate for defining an implanted capacitor, the sixth region forming the control gate of the storage transistor, and wherein the rows of the matrix are grouped in pairs of adjacent rows sharing a common second well.

10. The memory device according to claim 1, wherein each memory cell includes a sixth region and a seventh region of the second type of conductivity formed in the second well with a channel region therebetween in front of the floating gate for defining a control transistor of MOS type, the channel region being short-circuited to at least one of the sixth and seventh region to form the control gate of the storage transistor, and wherein all the memory cells of the matrix share a common insulating region.

11. A non-volatile memory cell, comprising:
  a storage transistor having a floating gate capacitively coupled to a control gate of a control transistor, a body, and first and second conduction nodes;
  a first access transistor having a gate, a body coupled to the body of the storage transistor, a first conduction node, and a second conduction node coupled to the first conduction node of the storage transistor; and
  a second access transistor having a gate, a body coupled to the body of the storage transistor, a first conduction node coupled to the second conduction node of the storage transistor, and a second conduction node.

12. The non-volatile memory cell of claim 11 wherein the storage, first access, and second access transistors comprise respective N-channel transistors.

13. The non-volatile memory cell of claim 11 wherein the second conduction node of the second access transistor is coupled to the body of the second access transistor.

14. The non-volatile memory cell of claim 11, further comprising a word-line node capacitively coupled to the floating gate of the storage transistor.

15. The non-volatile memory cell of claim 11, further comprising:
  a first access-control node coupled to the gate of the first access transistor; and a second access-control node coupled to the gate of the second access transistor.

16. The non-volatile memory cell of claim 11, further comprising a bit-line node coupled to the first conduction node of the first access transistor.

17. A non-volatile memory cell, comprising:
a storage transistor having a floating gate, a body, and first and second conduction nodes;
a first access transistor having a gate, a body coupled to the body of the storage transistor, a first conduction node, and a second conduction node coupled to the first conduction node of the storage transistor; and
a second access transistor having a gate, a body coupled to the body of the storage transistor, a first conduction node coupled to the second conduction node of the storage transistor, and a second conduction node;
further comprising a third access transistor having a gate, a body coupled to the body of the storage transistor, a first conduction node coupled to the second conduction node of the first access transistor, and a second conduction node coupled to the first conduction node of the storage transistor.

18. A non-volatile memory cell, comprising:
a storage transistor having a floating gate, a body, and first and second conduction nodes;
a first access transistor having a gate, a body coupled to the body of the storage transistor, a first conduction node, and a second conduction node coupled to the first conduction node of the storage transistor; and
a second access transistor having a gate, a body coupled to the body of the storage transistor, a first conduction node coupled to the second conduction node of the storage transistor, and a second conduction node;
further comprising:
a third access transistor having a gate, a body coupled to the body of the storage transistor, a first conduction node coupled to the second conduction node of the first access transistor, and a second conduction node coupled to the first conduction node of the storage transistor;
a first word-line node coupled to the floating gate of the storage transistor; and
a second word-line node coupled to the gate of the third access transistor.

19. A memory array, comprising:
a first bit line;
first and second access-control lines;
a first word line;
a first program-erase line; and
a first non-volatile memory cell, comprising:
a storage transistor having a floating gate capacitively coupled to the first word line, a body coupled to the first program-erase line, and first and second conduction nodes;
a first access transistor having a gate coupled to the first access-control line, a body coupled to the first program-erase line, a first conduction node coupled to the first bit line, and a second conduction node coupled to the first conduction node of the storage transistor; and
a second access transistor having a gate coupled to the second access-control line, a body coupled to the first program-erase line, a first conduction node coupled to the second conduction node of the storage transistor, and a second conduction node coupled to the first program-erase line.

20. A memory array, comprising:
a first bit line;
first and second access-control lines;
a first word line;
a first program-erase line; and
a first non-volatile memory cell, comprising:
a storage transistor having a floating gate coupled to the first word line, a body coupled to the first program-erase line, and first and second conduction nodes;
a first access transistor having a gate coupled to the first access-control line, a body coupled to the first program-erase line, a first conduction node coupled to the first bit line, and a second conduction node coupled to the first conduction node of the storage transistor; and
a second access transistor having a gate coupled to the second access-control line, a body coupled to the first program-erase line, a first conduction node coupled to the second conduction node of the storage transistor, and a second conduction node coupled to the first program-erase line;
further comprising:
a second word line; and
wherein the first non-volatile memory cell further comprises a third access transistor having a gate coupled to the second word line, a body coupled to the first program-erase line, a first conduction node coupled to the second conduction node of the first access transistor, and a second conduction node coupled to the first conduction node of the storage transistor.

21. The memory array of claim 19, further comprising:
a second bit line;
third and fourth access-control lines; and
a second non-volatile memory cell, comprising:
a storage transistor having a floating gate coupled to the first word line, a body coupled to the first program-erase line, and first and second conduction nodes;
a first access transistor having a gate coupled to the third access-control line, a body coupled to the first program-erase line, a first conduction node coupled to the second bit line, and a second conduction node coupled to the first conduction node of the storage transistor; and
a second access transistor having a gate coupled to the fourth access-control line, a body coupled to the first program-erase line, a first conduction node coupled to the second conduction node of the storage transistor, and a second conduction node coupled to the first program-erase line.

22. The memory array of claim 19, further comprising:
a second word line;
a second program-erase line; and
a second non-volatile memory cell, comprising:
a storage transistor having a floating gate coupled to the second word line, a body coupled to the second program-erase line, and first and second conduction nodes;
a first access transistor having a gate coupled to the first access-control line, a body coupled to the second program-erase line, a first conduction node coupled to the first bit line, and a second conduction node coupled to the first conduction node of the storage transistor; and
a second access transistor having a gate coupled to the second access-control line, a body coupled to the second program-erase line, a first conduction node coupled to the second conduction node of the storage transistor, and a second conduction node coupled to the second program-erase line.

23. The memory array of claim 19, further comprising:
third and fourth access-control lines; and
a second non-volatile memory cell, comprising:

a storage transistor having a floating gate coupled to the first word line, a body coupled to the first program-erase line, and first and second conduction nodes;

a first access transistor having a gate coupled to the third access-control line, a body coupled to the first program-erase line, a first conduction node coupled to the first bit line, and a second conduction node coupled to the first conduction node of the storage transistor; and a second access transistor having a gate coupled to the fourth access-control line, a body coupled to the first program-erase line, a first conduction node coupled to the second conduction node of the storage transistor, and a second conduction node coupled to the first program-erase line.

24. A system, comprising:
an integrated memory array, comprising:
a first bit line;
first and second access-control lines;
a first word line;
a first program-erase line; and
a first non-volatile memory cell, comprising:
a storage transistor having a floating gate capacitively coupled to the first word line, a body coupled to the first program-erase line, and first and second conduction nodes;
a first access transistor having a gate coupled to the first access-control line, a body coupled to the first program-erase line, a first conduction node coupled to the first bit line, and a second conduction node coupled to the first conduction node of the storage transistor; and
a second access transistor having a gate coupled to the second access-control line, a body coupled to the first program-erase line, a first conduction node coupled to the second conduction node of the storage transistor, and a second conduction node coupled to the first program-erase line; and
an integrated circuit coupled to the integrated memory array.

25. The system of claim 24 wherein the integrated memory array and the integrated circuit are disposed on a same integrated-circuit die.

26. The system of claim 24 wherein the integrated memory array and the integrated circuit are disposed on respective integrated-circuit dies.

27. The system of claim 24 wherein the integrated circuit comprises a controller.

28. A system, comprising:
an integrated memory array, comprising:
a first bit line;
first and second access-control lines;
a first word line;
a first program-erase line; and
a first non-volatile memory cell, comprising:
a storage transistor having a floating gate coupled to the first word line, a body coupled to the first program-erase line, and first and second conduction nodes;
a first access transistor having a gate coupled to the first access-control line, a body coupled to the first program-erase line, a first conduction node coupled to the first bit line, and a second conduction node coupled to the first conduction node of the storage transistor; and
a second access transistor having a gate coupled to the second access-control line, a body coupled to the first program-erase line, a first conduction node coupled to the second conduction node of the storage transistor, and a second conduction node coupled to the first program-erase line; and an integrated circuit coupled to the integrated memory array;
wherein the integrated memory array further comprises:
a second word line; and
wherein the first non-volatile memory cell further comprises a third access transistor having a gate coupled to the second word line, a body coupled to the first program-erase line, a first conduction node coupled to the second conduction node of the first access transistor, and a second conduction node coupled to the first conduction node of the storage transistor.

29. The system of claim 24 wherein the integrated memory array further comprises:
third and fourth access-control lines; and
a second non-volatile memory cell, comprising:
a storage transistor having a floating gate coupled to the first word line, a body coupled to the first program-erase line, and first and second conduction nodes;
a first access transistor having a gate coupled to the third access-control line, a body coupled to the first program-erase line, a first conduction node coupled to the first bit line, and a second conduction node coupled to the first conduction node of the storage transistor; and
a second access transistor having a gate coupled to the fourth access-control line, a body coupled to the first program-erase line, a first conduction node coupled to the second conduction node of the storage transistor, and a second conduction node coupled to the first program-erase line.

30. A method, comprising:
electrically isolating a first conduction node of a storage transistor with a first access transistor;
coupling a floating gate of the storage transistor to a first voltage;
coupling a second conduction node of the storage transistor to a second voltage via a second access transistor; and
coupling a body of the storage transistor to the second voltage to change a level of charge on the floating gate.

31. The method of claim 30 wherein electrically isolating the first conduction node comprises electrically isolating the first conduction node of the storage transistor from a bit line with the first access transistor.

32. The method of claim 30 wherein the first voltage is higher than the second voltage.

33. The method of claim 30 wherein the first voltage is lower than the second voltage.

34. The method of claim 30 wherein coupling the body of the storage transistor to the second voltage comprises coupling the body of the storage transistor to the second voltage to increase the level of charge on the floating gate.

35. The method of claim 30 wherein coupling the body of the storage transistor to the second voltage comprises coupling the body of the storage transistor to the second voltage to decrease the level of charge on the floating gate.

36. The method of claim 30 wherein coupling the body of the storage transistor to the second voltage comprises coupling the body of the storage transistor to the second voltage to program the storage transistor.

37. The method of claim 30 wherein coupling the body of the storage transistor to the second voltage comprises coupling the body of the storage transistor to the second voltage to erase the storage transistor.

38. The method of claim 30, further comprising electrically isolating the first conduction node of the storage transistor with a select transistor that is serially coupled with the first access and storage transistors.

39. A method, comprising:
- electrically isolating a first conduction node of a storage transistor with a first access transistor;
- electrically isolating a second conduction node of the storage transistor with a second access transistor;
- coupling a floating gate of the storage transistor to a first voltage; and
- coupling a body of the storage transistor to the second voltage to change a level of charge on the floating gate.

40. The method of claim 39 wherein electrically isolating the first conduction node comprises electrically isolating the first conduction node of the storage transistor from a bit line with the first access transistor.

41. The method of claim 39 wherein electrically isolating the second conduction node comprises electrically isolating the second conduction node of the storage transistor from a well in which the storage transistor is disposed.

42. The method of claim 39 wherein the first voltage is higher than the second voltage.

43. The method of claim 39 wherein the first voltage is lower than the second voltage.

44. The method of claim 39 wherein coupling the body of the storage transistor to the second voltage comprises coupling the body of the storage transistor to the second voltage to increase the level of charge on the floating gate.

45. The method of claim 39 wherein coupling the body of the storage transistor to the second voltage comprises coupling the body of the storage transistor to the second voltage to decrease the level of charge on the floating gate.

46. The method of claim 39 wherein coupling the body of the storage transistor to the second voltage comprises coupling the body of the storage transistor to the second voltage to program the storage transistor.

47. The method of claim 39 wherein coupling the body of the storage transistor to the second voltage comprises coupling the body of the storage transistor to the second voltage to erase the storage transistor.

48. The method of claim 39, further comprising electrically isolating the first conduction node of the storage transistor with a select transistor that is serially coupled with the first access and storage transistors.

* * * * *